US011876094B2

(12) United States Patent
Huang

(10) Patent No.: US 11,876,094 B2
(45) Date of Patent: Jan. 16, 2024

(54) METHOD FOR FABRICATING SEMICONDUCTOR DEVICE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 262 days.

(21) Appl. No.: 17/526,141

(22) Filed: Nov. 15, 2021

(65) Prior Publication Data

US 2022/0077144 A1 Mar. 10, 2022

Related U.S. Application Data

(62) Division of application No. 16/658,949, filed on Oct. 21, 2019, now abandoned.

(51) Int. Cl.
*H01L 27/088* (2006.01)
*H01L 29/49* (2006.01)
*H01L 29/423* (2006.01)
*H01L 21/8234* (2006.01)
*H01L 29/78* (2006.01)
*H01L 29/51* (2006.01)

(52) U.S. Cl.
CPC .... *H01L 27/088* (2013.01); *H01L 21/823462* (2013.01); *H01L 29/4236* (2013.01); *H01L 29/4966* (2013.01); *H01L 29/513* (2013.01); *H01L 29/7842* (2013.01)

(58) Field of Classification Search
None
See application file for complete search history.

(56) References Cited

U.S. PATENT DOCUMENTS

| | | | |
|---|---|---|---|
| 9,177,865 B2* | 11/2015 | Kim | H01L 21/28088 |
| 2003/0183877 A1* | 10/2003 | Yagishita | H01L 21/84 |
| | | | 257/E21.703 |
| 2010/0013017 A1* | 1/2010 | Tsutsui | H01L 21/823462 |
| | | | 438/770 |
| 2013/0299914 A1* | 11/2013 | Kim | H01L 29/517 |
| | | | 257/369 |
| 2014/0363960 A1* | 12/2014 | Kim | H01L 21/82345 |
| | | | 438/585 |

(Continued)

OTHER PUBLICATIONS

Office Action dated Jan. 27, 2023 related to U.S. Appl. No. 16/658,949, wherein this application is a DIV of U.S. Appl. No. 16/658,949.

(Continued)

*Primary Examiner* — Nishath Yasmeen
(74) *Attorney, Agent, or Firm* — Xuan Zhang

(57) ABSTRACT

The present application discloses a method for fabricating a semiconductor device. The method includes providing a substrate and concurrently forming a first semiconductor unit, a second semiconductor unit, and a third semiconductor unit in the substrate. The first semiconductor unit has a first insulating stack, the second semiconductor unit has a second insulating stack, and the third semiconductor unit has a third insulating stack; and thicknesses of the first insulating stack, the second insulating stack, and the third insulating stack are all different.

20 Claims, 31 Drawing Sheets

(56) References Cited

U.S. PATENT DOCUMENTS

| | | | | |
|---|---|---|---|---|
| 2015/0069524 A1* | 3/2015 | Hong | ................ | H01L 21/82385 |
| | | | | 438/587 |
| 2015/0236125 A1* | 8/2015 | Tu | ........................ | H01L 29/161 |
| | | | | 438/285 |
| 2015/0262822 A1* | 9/2015 | Hung | ................ | H01L 29/66553 |
| | | | | 257/412 |
| 2015/0263004 A1* | 9/2015 | Cheon | ............... | H01L 29/42372 |
| | | | | 257/392 |
| 2016/0225867 A1* | 8/2016 | Kim | .................... | H01L 27/0924 |
| 2017/0236821 A1* | 8/2017 | Kim | .................... | H01L 29/7856 |
| | | | | 257/401 |
| 2018/0151376 A1* | 5/2018 | Choi | ................ | H01L 21/31053 |
| 2019/0122891 A1* | 4/2019 | Wang | .................... | H01L 29/517 |

OTHER PUBLICATIONS

Office Action dated Apr. 19, 2022 related to U.S. Appl. No. 16/658,949, wherein this application is a DIV of U.S. Appl. No. 16/658,949.

\* cited by examiner

METHOD FOR FABRICATING SEMICONDUCTOR DEVICE

CROSS-REFERENCE TO RELATED APPLICATION

This application is a divisional application of U.S. Non-Provisional application Ser. No. 16/658,949 filed Oct. 21, 2019, which is incorporated herein by reference in its entirety.

TECHNICAL FIELD

The present disclosure relates to a method for fabricating a semiconductor device, and more particularly, to a method for fabricating a semiconductor device with multiple threshold voltages.

DISCUSSION OF THE BACKGROUND

Semiconductor devices are used in a variety of electronic applications, such as personal computers, cellular telephones, digital cameras, and other electronic equipment. In addition, demands for more sophisticated designs of semiconductor devices are arising.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first semiconductor unit having a first threshold voltage and a first insulating stack in the substrate, a second semiconductor unit having a second threshold voltage and a second insulating stack in the substrate, and a third semiconductor unit having a third threshold voltage and a third insulating stack in the substrate. The first threshold voltage, the second threshold voltage, and the third threshold voltage are different from each other. A thickness of the first insulating stack is different from a thickness of the second insulating stack and a thickness of the third insulating stack. The thickness of the second insulating stack is different from the thickness of the third insulating stack.

In some embodiments, the first insulating stack comprises a first bottom insulating layer inwardly positioned in the substrate, and the third insulating stack comprises a third bottom insulating layer inwardly positioned in the substrate and a third top insulating layer positioned on the third bottom insulating layer.

In some embodiments, the second insulating stack comprises a second bottom insulating layer inwardly positioned in the substrate, a second middle insulating layer positioned on the second bottom insulating layer, and a second top insulating layer positioned on the second middle insulating layer.

In some embodiments, the first semiconductor unit further comprises a first bottom conductive layer positioned on the first bottom insulating layer, and the first bottom conductive layer has a thickness between about 10 angstroms and about 200 angstroms.

In some embodiments, the first semiconductor unit further comprises a first top conductive layer positioned on the first bottom conductive layer, and the first top conductive layer has a thickness between about 10 angstroms and about 100 angstroms.

In some embodiments, the first semiconductor unit further comprises a first filler layer positioned on the first top conductive layer, and the first filler layer is formed of tungsten or aluminum.

In some embodiments, the second semiconductor unit further comprises a second bottom conductive layer positioned on the second top insulating layer, and the second bottom conductive layer has a thickness between about 10 angstroms and about 100 angstroms.

In some embodiments, the second semiconductor unit further comprises a second top conductive layer positioned on the second bottom conductive layer, and the second top conductive layer has a thickness between about 10 angstroms and about 200 angstroms.

In some embodiments, the second semiconductor unit further comprises a second pair of stress regions attached to lower portions of the two sides of the second semiconductor unit, and the second pair of stress regions are formed of silicon carbide.

In some embodiments, the third semiconductor unit further comprises a third bottom conductive layer positioned on the third top insulating layer, and the third bottom conductive layer has a thickness between about 10 angstroms and about 100 angstroms.

In some embodiments, the third semiconductor unit further comprises a third top conductive layer positioned on the third bottom conductive layer, and the third top conductive layer has a thickness between about 10 angstroms and about 200 angstroms.

In some embodiments, the third semiconductor unit further comprises a third filler layer positioned on the third top conductive layer and a third capping layer positioned on the third filler layer.

In some embodiments, the second semiconductor unit further comprises a second interfacial layer positioned between the substrate and the second bottom insulating layer, and the second interracial layer has a thickness less than 2 nm.

In some embodiments, the second semiconductor unit further comprises a second functional layer positioned between the second top insulating layer and the second bottom conductive layer, and the second functional layer has a thickness between about 10 angstroms and about 15 angstroms.

In some embodiments, the second semiconductor unit further comprises a second dipole layer positioned between the substrate and the second bottom insulating layer, and the second dipole layer is formed of a material including one or more of lutetium oxide, lutetium silicon oxide, yttrium oxide, yttrium silicon oxide, lanthanum oxide, lanthanum silicon oxide, barium oxide, or barium silicon oxide.

In some embodiments, the second semiconductor unit further comprises a second protection layer positioned between the second top insulating layer and the second bottom conductive layer, and the second protection layer is formed of titanium nitride.

In some embodiments, the second semiconductor unit further comprises a second encapsulation layer positioned between the second filler layer and the second top conductive layer, and the second encapsulation layer has a thickness between about 15 angstroms and about 25 angstroms.

Another aspect of the present disclosure provides a method for fabricating a semiconductor device including providing a substrate and concurrently forming a first semiconductor unit, a second semiconductor unit, and a third semiconductor unit in the substrate. The first semiconductor unit includes a first insulating stack, the second semiconductor unit includes a second insulating stack, and the third semiconductor unit includes a third insulating stack. Thicknesses of the first insulating stack, the second insulating stack, and the third insulating stack are all different.

In some embodiments, the method for fabricating the semiconductor device further comprises forming a plurality of trenches in the substrate and forming a first insulating film over the substrate and in the plurality of trenches.

In some embodiments, the method for fabricating the semiconductor device further comprises removing portions of the first insulating film and forming a second insulating film over the substrate.

Due to the design of the semiconductor device of the present disclosure, the first semiconductor unit, the second semiconductor unit, and the third semiconductor unit may have different threshold voltages and may provide different functions; therefore, the applicability of the semiconductor device may be increased. In addition, the carrier mobility of the semiconductor device may be improved. Furthermore, the threshold voltages of the semiconductor device may be fine-tuned.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
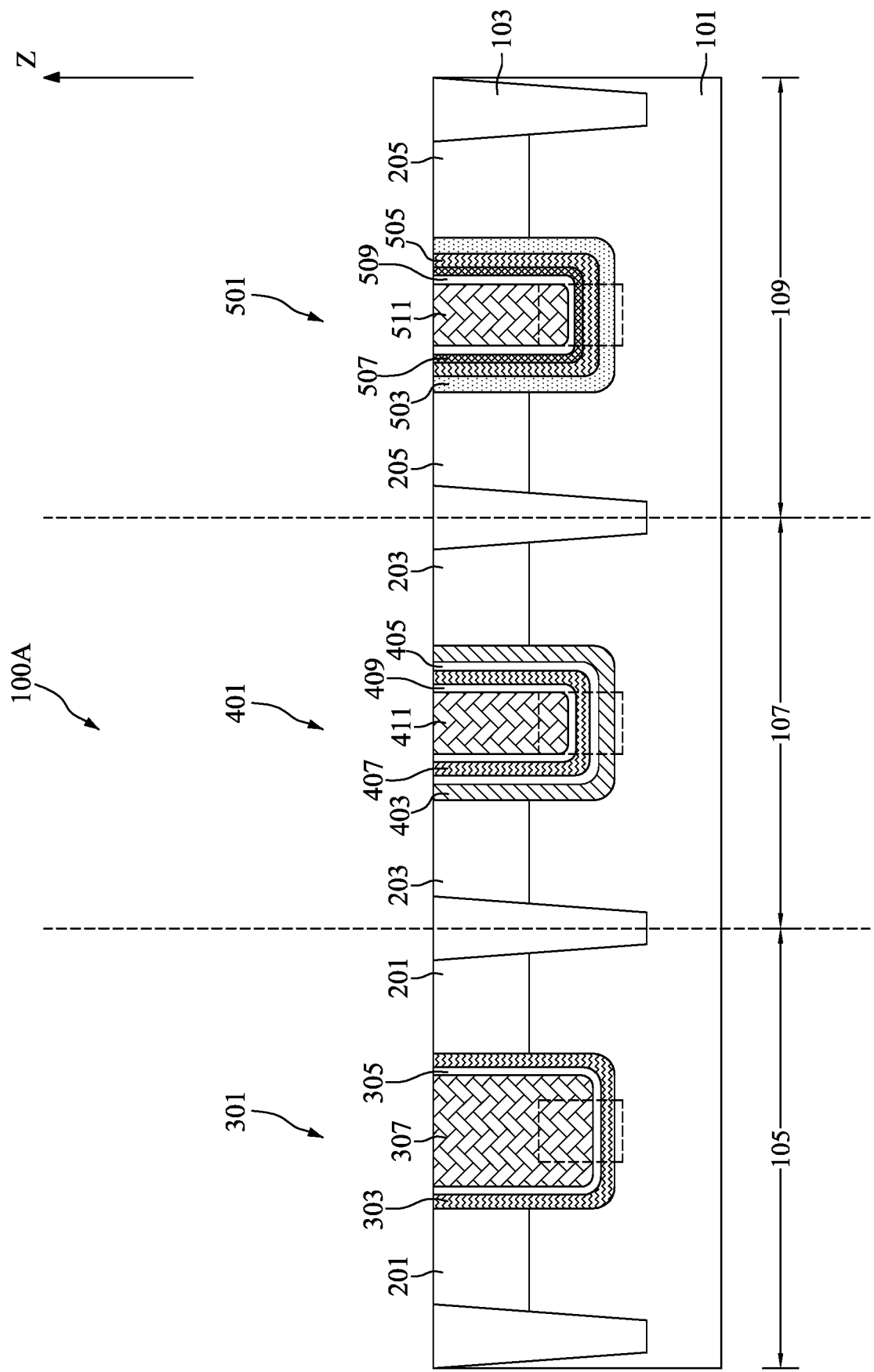
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. A semiconductor element with a lower threshold voltage may have a faster switching speed and may be suitable for providing computational logic functions. In contrast, a semiconductor element with a high threshold voltage may decrease power consumption of the semiconductor element and may be suitable to implement in storage functions. Therefore, a semiconductor device with semiconductor elements with multiple threshold voltages may have broader applicability than a semiconductor device with only a single threshold voltage.

It should be noted that, in the description of the present disclosure, above (or up) corresponds to the direction of the arrow of the direction Z, and below (or down) corresponds to the opposite direction of the arrow of the direction Z.

Figure 2:
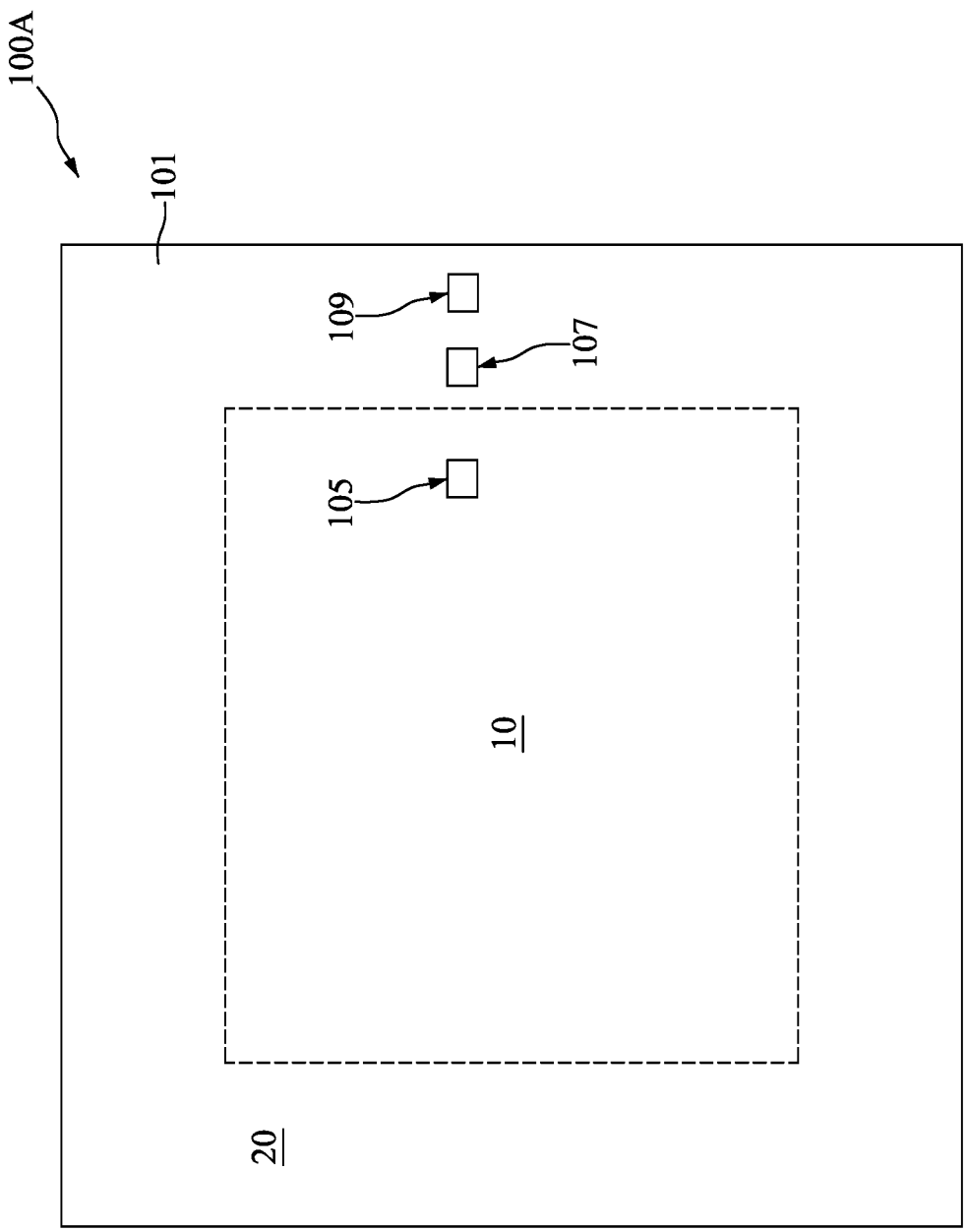
FIG. 2 illustrates, in a schematic top-view diagram, the semiconductor device in accordance with one embodiment of the present disclosure.
Figure 3:
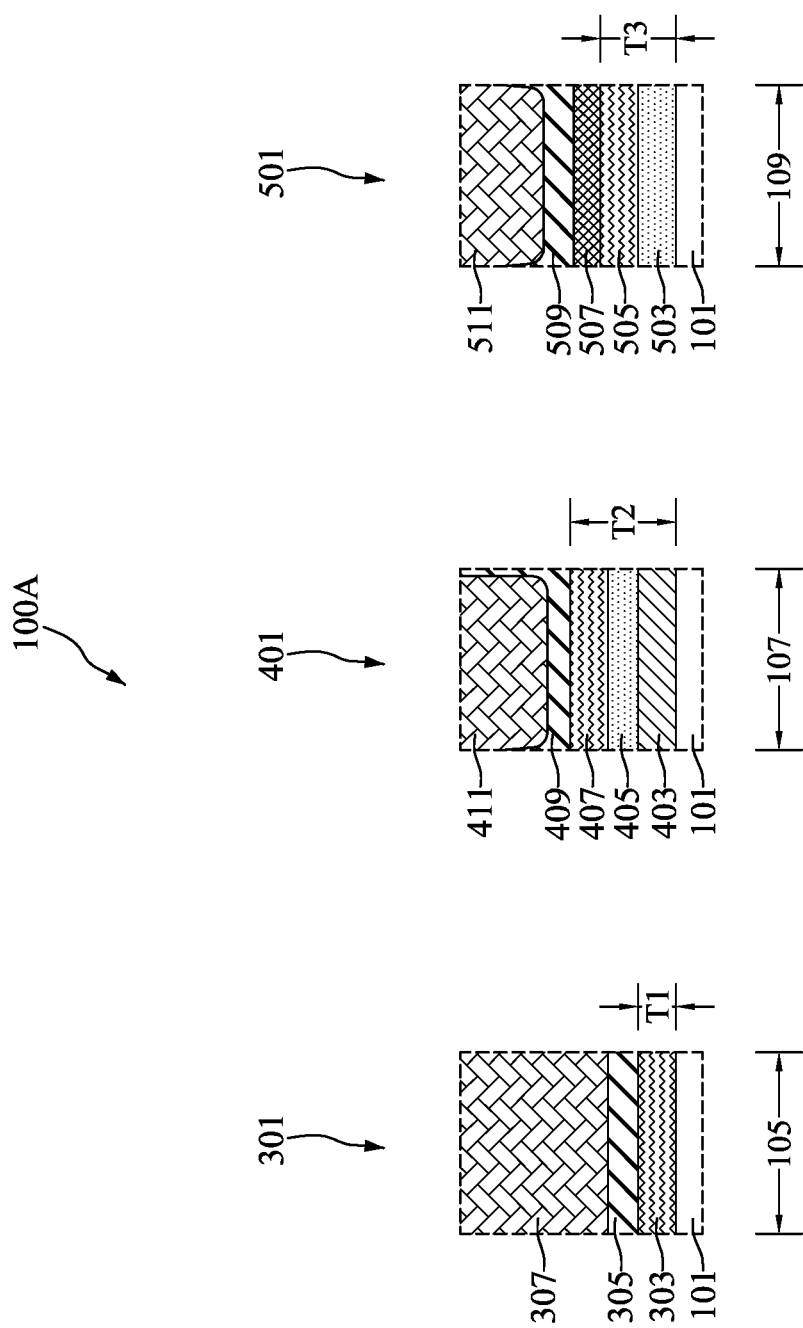
FIG. 3 illustrates, in a schematic enlarged cross-sectional view diagram, the semiconductor device in accordance with FIG. 1.

FIG. 1 illustrates, in a schematic cross-sectional view diagram, a semiconductor device 100A in accordance with one embodiment of the present disclosure. FIG. 2 illustrates, in a schematic top-view diagram, the semiconductor device 100A in accordance with one embodiment of the present disclosure. FIG. 3 illustrates, in a schematic enlarged cross-sectional view diagram, the semiconductor device 100A in accordance with FIG. 1.

With reference to FIGS. 1 to 3, in the embodiment depicted, the semiconductor device 100A may include a substrate 101, an isolation layer 103, a plurality of doped regions, a first semiconductor unit 301, a second semiconductor unit 401, and a third semiconductor unit 501.

With reference to FIGS. 1 to 3, in the embodiment depicted, the substrate 101 may include an array area 10 and a peripheral area 20. The array area 10 may be in the center of the substrate 101. The peripheral area 20 may surround the peripheral area 20. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <100>.

Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIGS. 1 to 3, in the embodiment depicted, the isolation layer 103 may be disposed in the substrate 101. In some embodiments, the isolation layer 103 may be disposed in an upper portion of the substrate 101. The isolation layer 103 may define a first active region 105, a second active region 107, and a third active region 109 separated from each other. The first active region 105 may be located at the array area 10 of the substrate 101. The second active region 107 and the third active region 109 may be located at the peripheral area 20 of the substrate 101. Alternatively, in another embodiment, the first active region 105, the second active region 107, and the third active region 109 may be all located at the array area 10 or all located at the peripheral area 20, but are not limited thereto. Alternatively, in another embodiment, the first active region 105, the second active region 107, and the third active region 109 may be connected to each other. The isolation layer 103 may be formed of, for example, an insulating material such as silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, in the embodiment depicted, the plurality of doped regions may be disposed in the substrate 101. In some embodiments, the plurality of doped regions may be respectively correspondingly disposed in the first active region 105, the second active region 107, and the third active region 109. The plurality of doped regions may include two first doped regions 201, two second doped regions 203, and two third doped regions 205.

With reference to FIGS. 1 to 3, in the embodiment depicted, the two first doped regions 201 may be disposed in the first active region 105 and separated from each other. Top surfaces of the two first doped regions 201 may be even with a top surface of the substrate 101. The two first doped regions 201 may be doped with a dopant such as phosphorus, arsenic, or antimony and have a first electrical type. The two second doped regions 203 may be disposed in the second active region 107 and separated from each other. Top surfaces of the two second doped regions 203 may be even with the top surface of the substrate 101. The two second doped regions 203 may have a same electrical type as the two first doped regions 201. The two third doped regions 205 may be disposed in the third active region 109 and separated from each other. Top surfaces of the two third doped regions 205 may be even with the top surface of the substrate 101. The two third doped regions 205 may be doped with a dopant such as boron and have a second electrical type. The second electrical type may be different from the first electrical type.

With reference to FIGS. 1 to 3, in the embodiment depicted, the first semiconductor unit 301 may be disposed in the first active region 105 and between the two first doped regions 201. The first semiconductor unit 301 may have a first threshold voltage. The first semiconductor unit 301 may include a first insulating stack, a first bottom conductive layer 305, and a first filler layer 307. The first insulating stack may be disposed in the first active region 105 and include a first bottom insulating layer 303.

With reference to FIGS. 1 to 3, in the embodiment depicted, the first bottom insulating layer 303 may be inwardly disposed in the first active region 105. The two first doped regions 201 may be attached to two sides of the first bottom insulating layer 303. The first bottom insulating layer 303 may have a thickness between about 0.5 nm and about 5.0 nm. Preferably, the thickness of the first bottom insulating layer 303 may be between about 0.5 nm and about 2.5 nm. It should be noted that the thickness of the first bottom insulating layer 303 may be set to an arbitrary range depending on the circumstances.

The first bottom insulating layer 303 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIGS. 1 to 3, in the embodiment depicted, the first bottom conductive layer 305 may be disposed in the first active region 105 and on the first bottom insulating layer 303. The first bottom conductive layer 305 may have a thickness between about 10 angstroms and about 200 angstroms. Preferably, the thickness of the first bottom conductive layer 305 may be between about 10 angstroms and about 100 angstroms. The first bottom conductive layer 305 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

With reference to FIGS. 1 to 3, in the embodiment depicted, the first filler layer 307 may be disposed in the first active region 105 and on the first bottom conductive layer 305. A top surface of the first filler layer 307 may be even with the top surface of the substrate 101. The first filler layer 307 may be formed of, for example, tungsten or aluminum.

With reference to FIGS. 1 to 3, in the embodiment depicted, the second semiconductor unit 401 may be disposed in the second active region 107 and between the two second doped regions 203. The second semiconductor unit 401 may include a second insulating stack, a second bottom conductive layer 409, and a second filler layer 411. The second insulating stack may include a second bottom insulating layer 403, a second middle insulating layer 405, and a second top insulating layer 407. The second semiconductor unit 401 may have a second threshold voltage. The second threshold voltage may be greater than the first threshold voltage.

With reference to FIGS. 1 to 3, in the embodiment depicted, the second bottom insulating layer 403 may be inwardly disposed in the second active region 107. The two second doped regions 203 may be attached to two sides of the second bottom insulating layer 403. The second bottom insulating layer 403 may have a thickness between about 0.1 nm and about 3.0 nm. Preferably, the thickness of the second bottom insulating layer 403 may be between about 0.5 nm and about 2.5 nm. It should be noted that the thickness of the second bottom insulating layer 403 may be set to an arbitrary range depending on the circumstances. The second bottom insulating layer 403 may be formed of, for example, silicon oxide, silicon nitride, silicon oxynitride, silicon nitride oxide, or the like. Alternatively, in another embodiment, the second bottom insulating layer 403 may be formed of an insulating material having a dielectric constant of about 4.0 or greater.

With reference to FIGS. 1 to 3, in the embodiment depicted, the second middle insulating layer 405 may be disposed in the second active region 107 and on the second bottom insulating layer 403. The second middle insulating layer 405 may have a thickness between about 0.1 nm and about 2.0 nm. Preferably, the thickness of the second middle insulating layer 405 may be between about 0.5 nm to about 1.5 nm. It should be noted that the thickness of the second middle insulating layer 405 may be set to an arbitrary range depending on the circumstances. The second middle insulating layer 405 may be formed of, for example, an insulating material having a dielectric constant of about 4.0 or greater. Alternatively, in another embodiment, the second middle insulating layer 405 may be formed of, for example, silicon oxide, silicon nitride, silicon oxynitride, silicon nitride oxide, or the like.

With reference to FIGS. 1 to 3, in the embodiment depicted, the second top insulating layer 407 may be disposed in the second active region 107 and on the second middle insulating layer 405. The second top insulating layer 407 may have a same thickness as the first bottom insulating layer 303, but is not limited thereto. The second top insulating layer 407 may be formed of a same material as the first bottom insulating layer 303, but is not limited thereto. The second bottom conductive layer 409 may be disposed in the second active region 107 and on the second top insulating layer 407. The second bottom conductive layer 409 may have a same thickness as the first bottom conductive layer 305, but is not limited thereto. The second bottom conductive layer 409 may be formed of a same material as the first bottom conductive layer 305, but is not limited thereto. The second filler layer 411 may be disposed in the second active region 107 and on the second bottom conductive layer 409. The second filler layer 411 may be formed of a same material as the first bottom conductive layer 305, but is not limited thereto.

With reference to FIGS. 1 to 3, in the embodiment depicted, the third semiconductor unit 501 may be disposed in the third active region 109 and between the two third doped regions 205. The third semiconductor unit 501 may include a third insulating stack, a third bottom conductive layer 507, a third top conductive layer 509, and a third filler layer 511. The third insulating stack may include a third bottom insulating layer 503 and a third top insulating layer 505. The third semiconductor unit 501 may have a third threshold voltage. The third threshold voltage may be greater than the first threshold voltage and less than the second threshold voltage.

With reference to FIGS. 1 to 3, in the embodiment depicted, the third bottom insulating layer 503 may be inwardly disposed in the third active region 109. The two third doped regions 205 may be attached to two sides of the third bottom insulating layer 503. The third bottom insulating layer 503 may have a same thickness as the second middle insulating layer 405, but is not limited thereto. It should be noted that the thickness of the third bottom insulating layer 503 may be set to an arbitrary range depending on the circumstances. The third bottom insulating layer 503 may be formed of a same material as the second middle insulating layer 405, but is not limited thereto.

With reference to FIGS. 1 to 3, in the embodiment depicted, the third top insulating layer 505 may be disposed in the third active region 109 and on the third bottom insulating layer 503. The third top insulating layer 505 may have a same thickness as the second top insulating layer 407, but is not limited thereto. The third top insulating layer 505 may be formed of a same material as the second top insulating layer 407, but is not limited thereto. The third bottom conductive layer 507 may be disposed in the third active region 109 and on the third top insulating layer 505. The third bottom conductive layer 507 may have a thickness between about 10 angstroms and about 100 angstroms. The third bottom conductive layer 507 may be formed of, for example, titanium nitride, tantalum nitride, tantalum carbide, tungsten nitride, or ruthenium.

With reference to FIGS. 1 to 3, in the embodiment depicted, the third top conductive layer 509 may be disposed in the third active region 109 and on the third bottom conductive layer 507. The third top conductive layer 509 may have a same thickness as the second bottom conductive layer 409, but is not limited thereto. The third top conductive layer 509 may be formed of a same material as the second bottom conductive layer 409, but is not limited thereto. The third filler layer 511 may be disposed in the third active region 109 and on the third top conductive layer 509. The third filler layer 511 may be formed of a same material as the second filler layer 411, but is not limited thereto.

With reference to FIGS. 1 to 3, in the embodiment depicted, the first insulating stack of the first semiconductor unit 301 may have a thickness T1, which may be equal to the thickness of the first bottom insulating layer 303. The second insulating stack may have a thickness T2, which may be equal to a sum of the thicknesses of the second top insulating layer 407, the second middle insulating layer 405, and the second bottom insulating layer 403. The third insulating stack may have a thickness T3, which may be equal to a sum of the thicknesses of the third top insulating layer 505 and the third bottom insulating layer 503. The thickness T3 may be greater than the thickness T2 and the thickness T1. The thickness T2 may be greater than the thickness T1. The threshold voltage may be proportional to the thickness of the insulating stack; hence, the second threshold voltage of the second semiconductor unit 401 including the second insulating stack may be greater than the third threshold voltage of the third semiconductor unit 501 including the third insulating stack and the first threshold voltage of the first semiconductor unit 301 including the first insulating stack. Accordingly, the third threshold voltage of the third semiconductor unit 501 including the third insulating stack may be greater than the first threshold voltage of the first semiconductor unit 301 including the first insulating stack.

Figure 4:
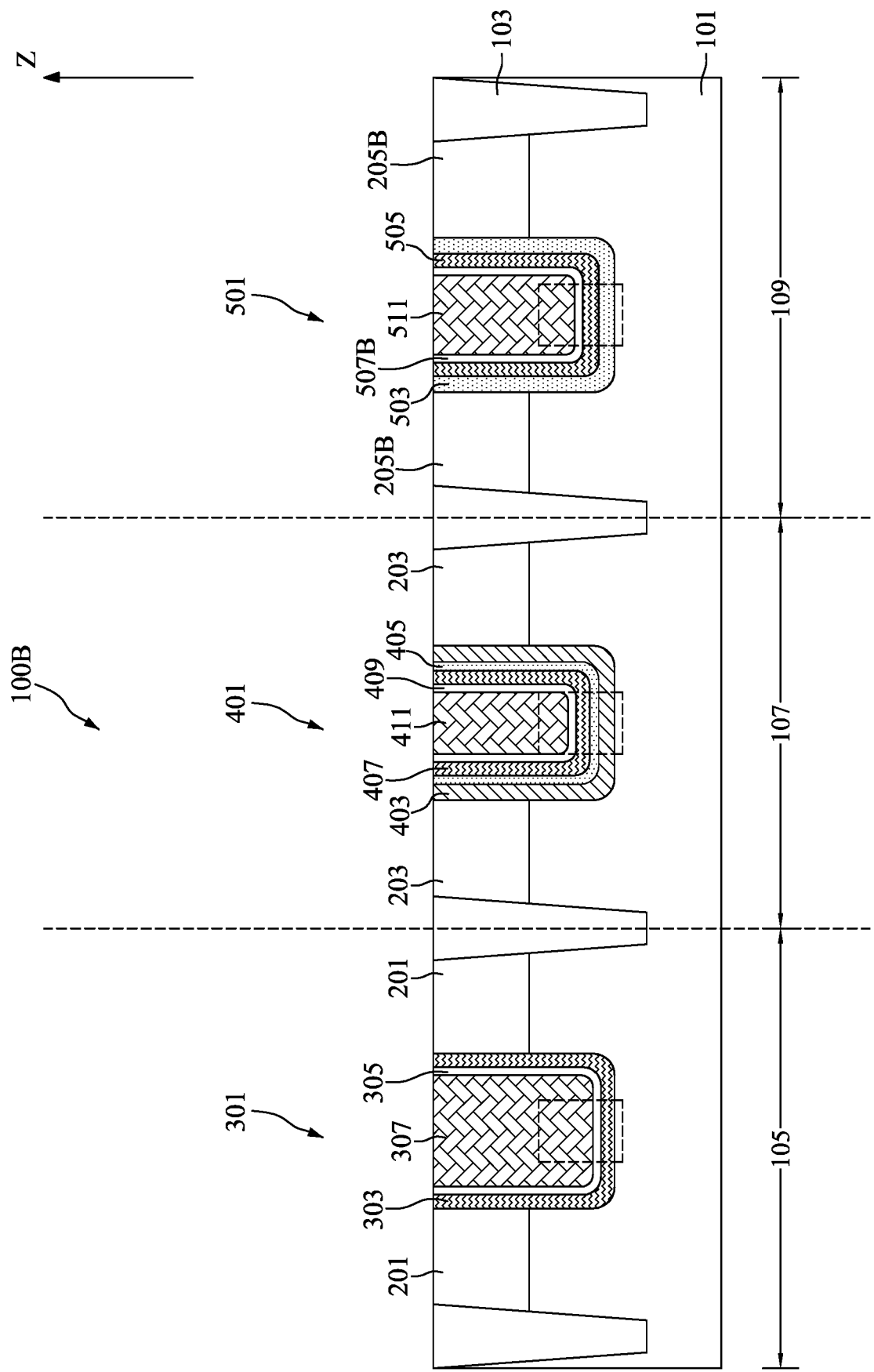
FIG. 4 illustrates, in a schematic cross-sectional view diagram, a semiconductor device in accordance with another embodiment of the present disclosure.
Figure 5:
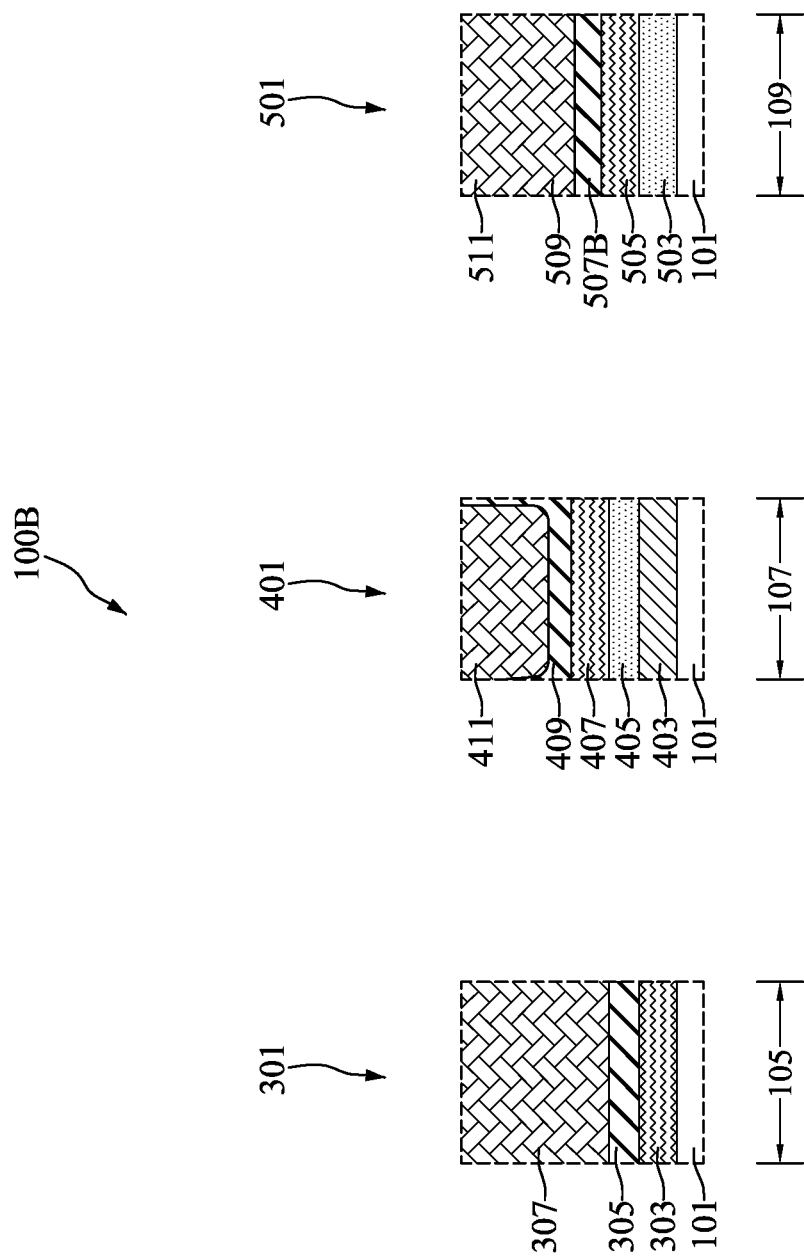
FIG. 5 illustrates, in a schematic enlarged cross-sectional view diagram, the semiconductor device in accordance with FIG. 4.

FIG. 4 illustrates, in a schematic cross-sectional view diagram, a semiconductor device 100B in accordance with another embodiment of the present disclosure. FIG. 5 illustrates, in a schematic enlarged cross-sectional view diagram, the semiconductor device 100B in accordance with FIG. 4.

With reference to FIGS. 4 and 5 and in contrast to FIG. 1, the two third doped regions 205B may have the first electrical type and may be doped with a dopant such as phosphorus, arsenic, or antimony. The third semiconductor unit 501 may include the third bottom insulating layer 503, the third top insulating layer 505, the third bottom conductive layer 507B, and the third filler layer 511. The third bottom insulating layer 503 may be inwardly disposed in the third active region 109. The third top insulating layer 505 may be disposed on the third bottom insulating layer 503. The third bottom conductive layer 507B may be disposed on the third top insulating layer 505. The third bottom conductive layer 507B may have a same thickness as the second bottom conductive layer 409 and may be formed of a same material as the second bottom conductive layer 409. The third filler layer 511 may be directly disposed on the third bottom conductive layer 507B.

Figure 6:
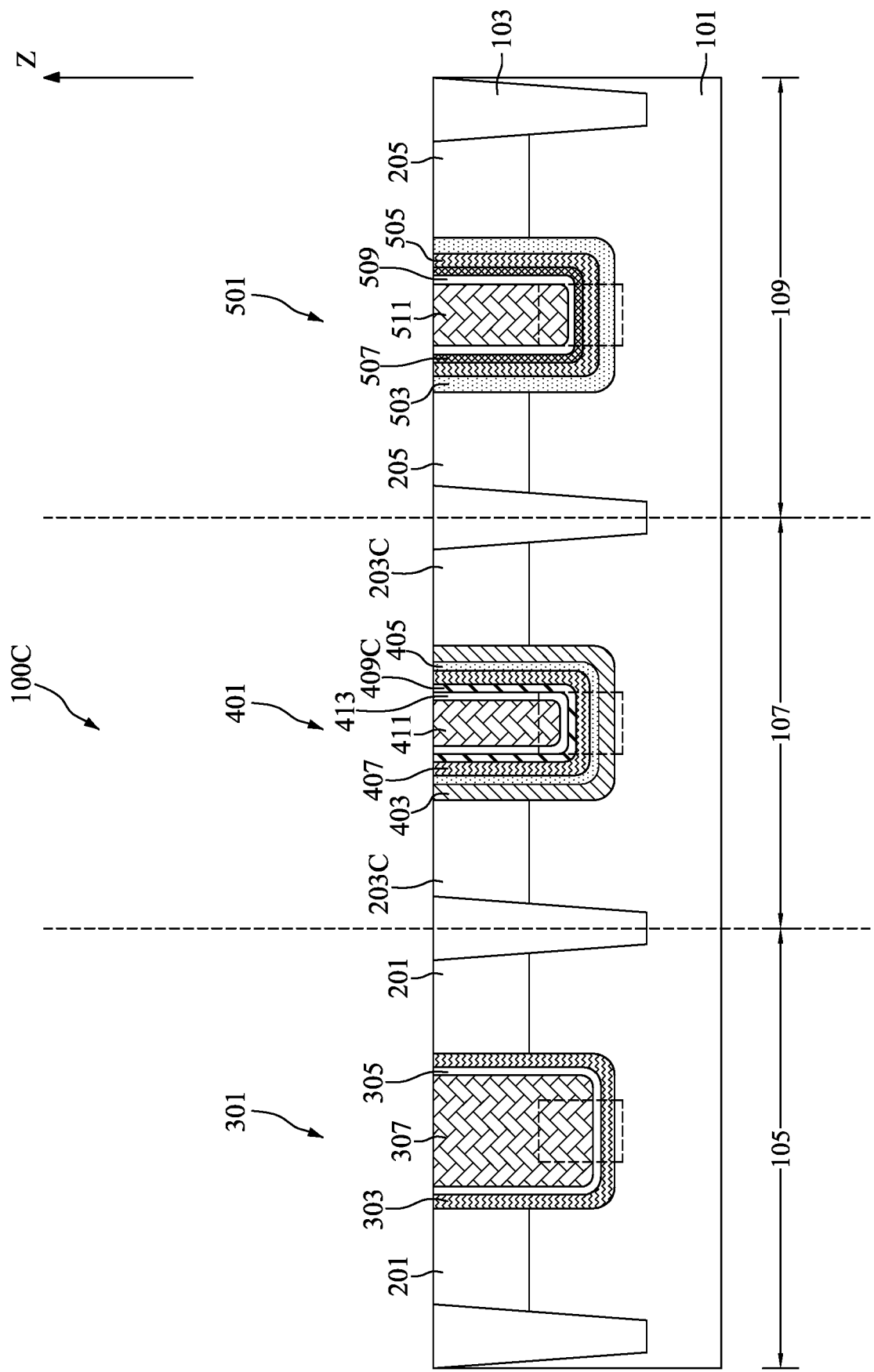
FIG. 6 illustrates, in a schematic cross-sectional view diagram, a semiconductor device in accordance with another embodiment of the present disclosure.
Figure 7:
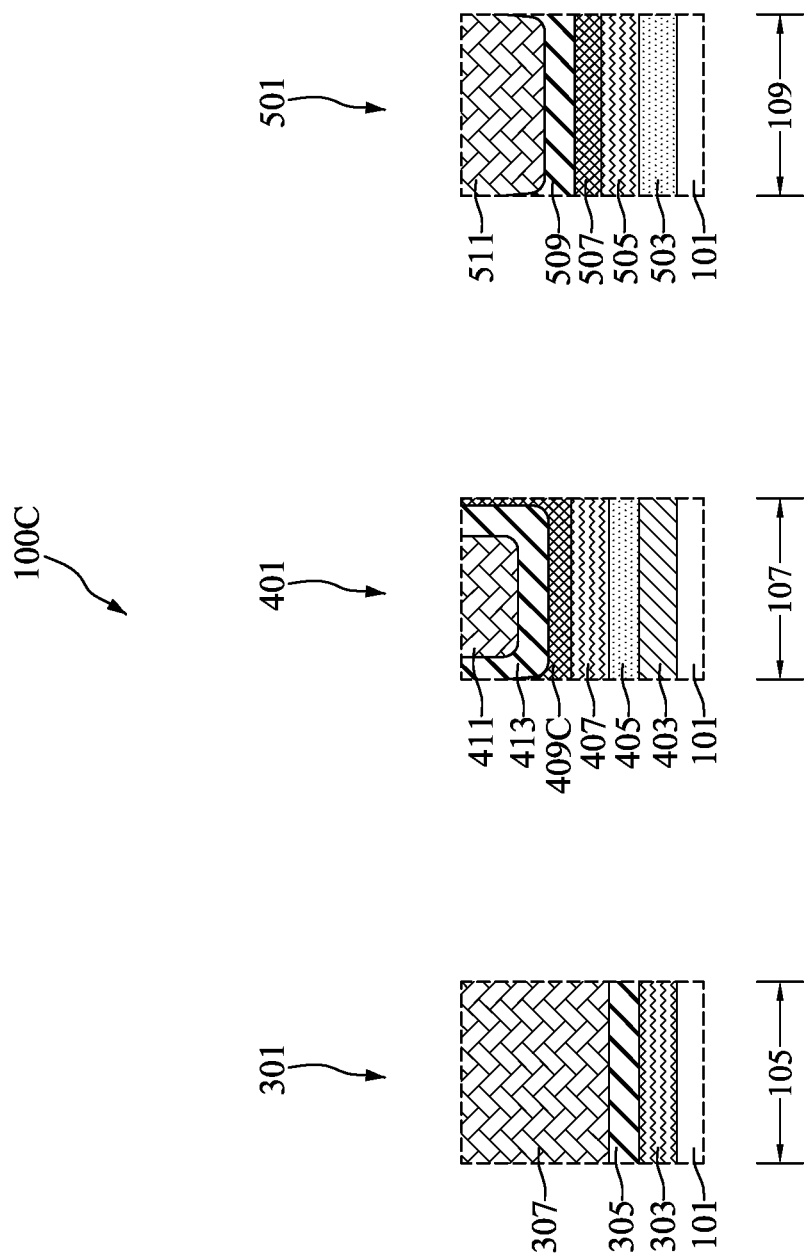
FIG. 7 illustrates, in a schematic enlarged cross-sectional view diagram, the semiconductor device in accordance with FIG. 6.

FIG. 6 illustrates, in a schematic cross-sectional view diagram, a semiconductor device 100C in accordance with another embodiment of the present disclosure. FIG. 7 illustrates, in a schematic enlarged cross-sectional view diagram, the semiconductor device 100C in accordance with FIG. 6.

With reference to FIGS. 6 and 7 and in contrast to FIG. 1, the two second doped regions 203C may have the second electrical type and may be doped with a dopant such as boron. The second semiconductor unit 401 may include the second bottom insulating layer 403, the second middle insulating layer 405, the second top insulating layer 407, the second bottom conductive layer 409C, the second filler layer 411, and a second top conductive layer 413. The second bottom insulating layer 403 may be inwardly disposed in the second active region 107. The second middle insulating layer 405 may be disposed on the second bottom insulating layer 403. The second top insulating layer 407 may be disposed on the second middle insulating layer 405. The second bottom conductive layer 409C may be disposed on the second top insulating layer 407. The second bottom conductive layer 409C may have a same thickness as the third bottom conductive layer 507 and may be formed of a same material as the third bottom conductive layer 507. The second top conductive layer 413 may be disposed on the second bottom conductive layer 409C. The second top conductive layer 413 may have a same thickness as the first bottom conductive layer 305 and may be formed of a same material as the first bottom conductive layer 305. The second filler layer 411 may be disposed on the second top conductive layer 413.

Figure 8:
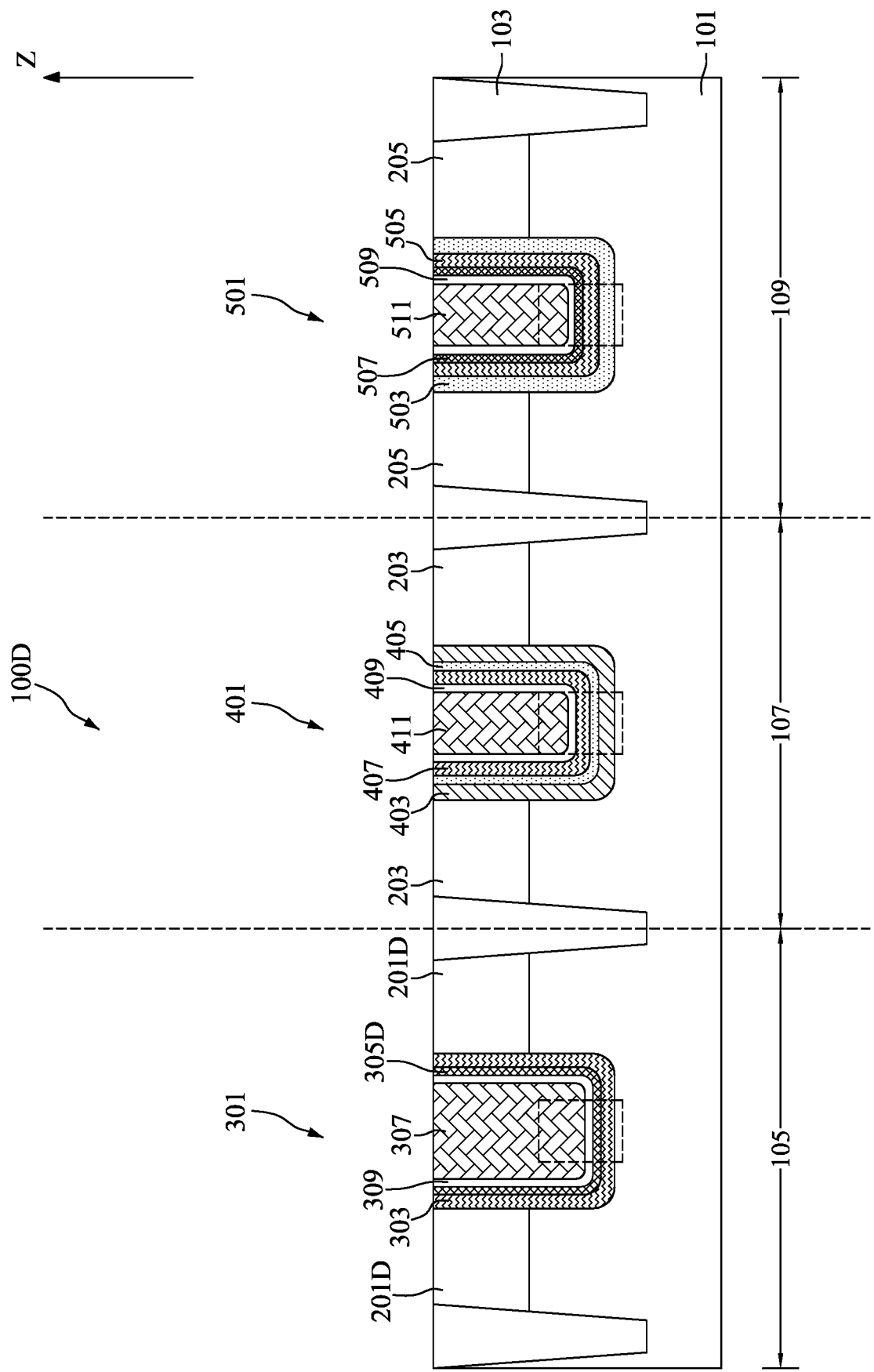
FIG. 8 illustrates, in a schematic cross-sectional view diagram, a semiconductor device in accordance with another embodiment of the present disclosure.
Figure 9:
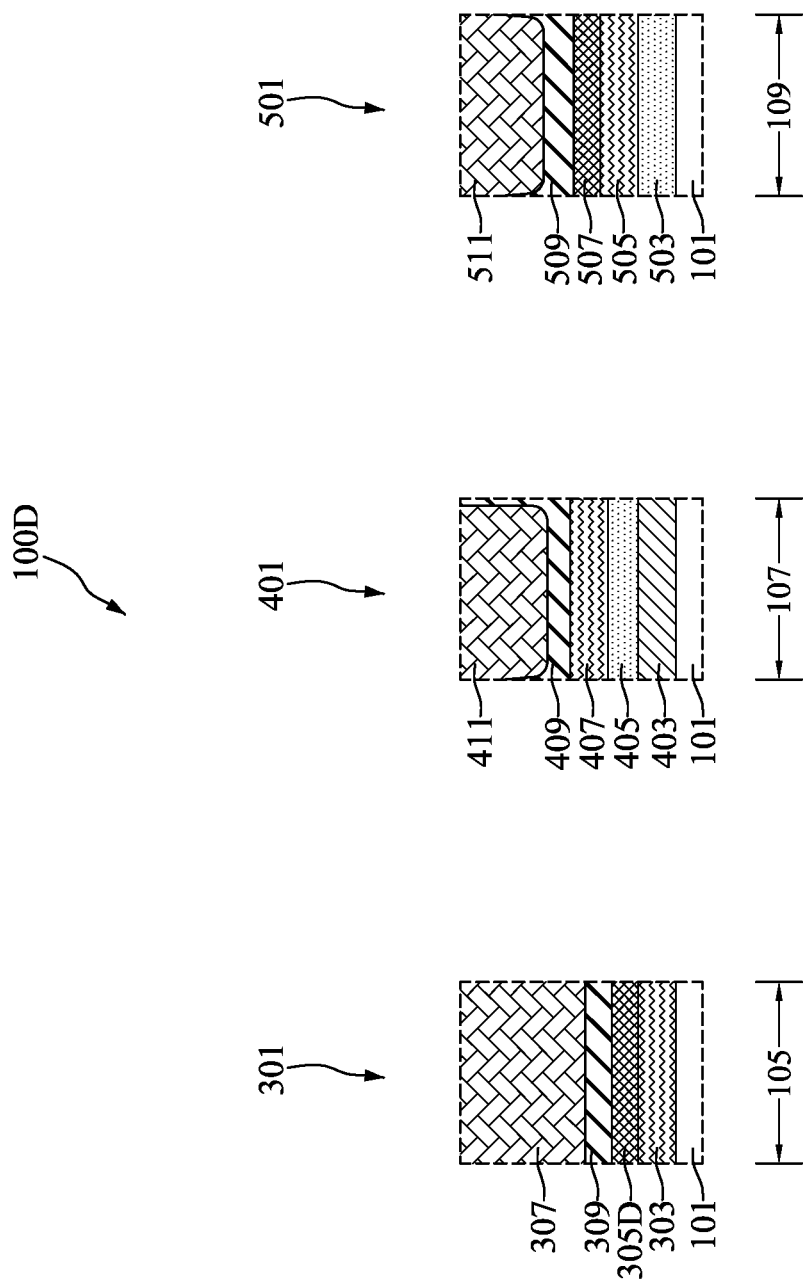
FIG. 9 illustrates, in a schematic enlarged cross-sectional view diagram, the semiconductor device in accordance with FIG. 8.

FIG. 8 illustrates, in a schematic cross-sectional view diagram, a semiconductor device 100D in accordance with another embodiment of the present disclosure. FIG. 9 illustrates, in a schematic enlarged cross-sectional view diagram, the semiconductor device 100D in accordance with FIG. 8.

With reference to FIGS. 8 and 9 and in contrast to FIG. 1, the two first doped regions 201D may have the second electrical type and may be doped with a dopant such as boron. The first semiconductor unit 301 may include the first bottom insulating layer 303, the first bottom conductive layer 305D, the first filler layer 307, and a first top conductive layer 309. The first bottom insulating layer 303 may be inwardly disposed in the first active region 105. The first bottom conductive layer 305D may be disposed on the first bottom insulating layer 303. The first bottom conductive layer 305D may have a thickness between about 10 angstroms and about 100 angstroms. The first bottom conductive layer 305D may be formed of, for example, titanium nitride, tantalum nitride, tantalum carbide, tungsten nitride, or ruthenium. The first top conductive layer 309 may be disposed on the first bottom conductive layer 305. The first top conductive layer 309 may have a thickness between about 10 angstroms and about 200 angstroms. The first top conductive layer 309 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

Figure 10:
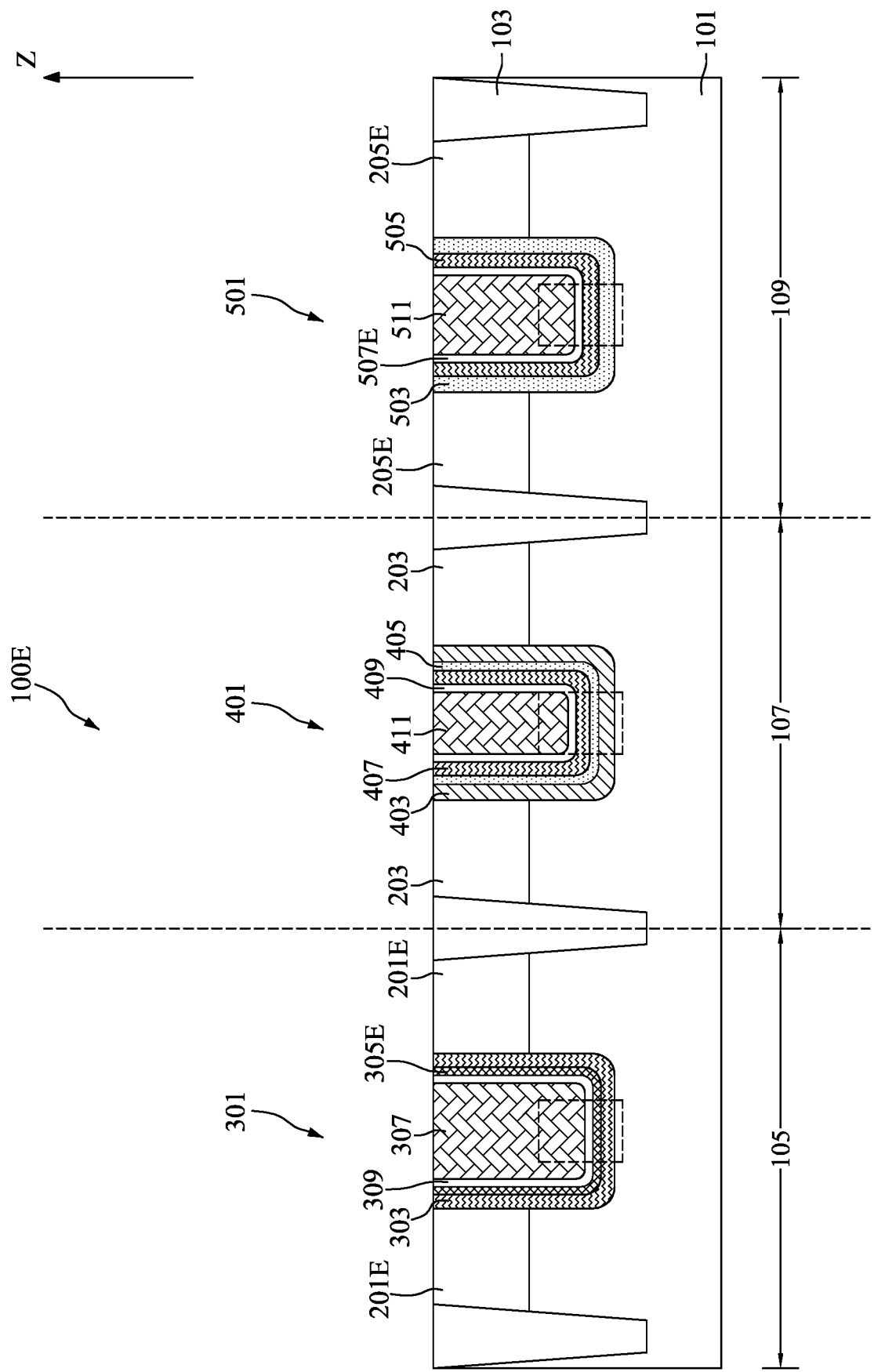
FIG. 10 illustrates, in a schematic cross-sectional view diagram, a semiconductor device in accordance with another embodiment of the present disclosure.
Figure 11:
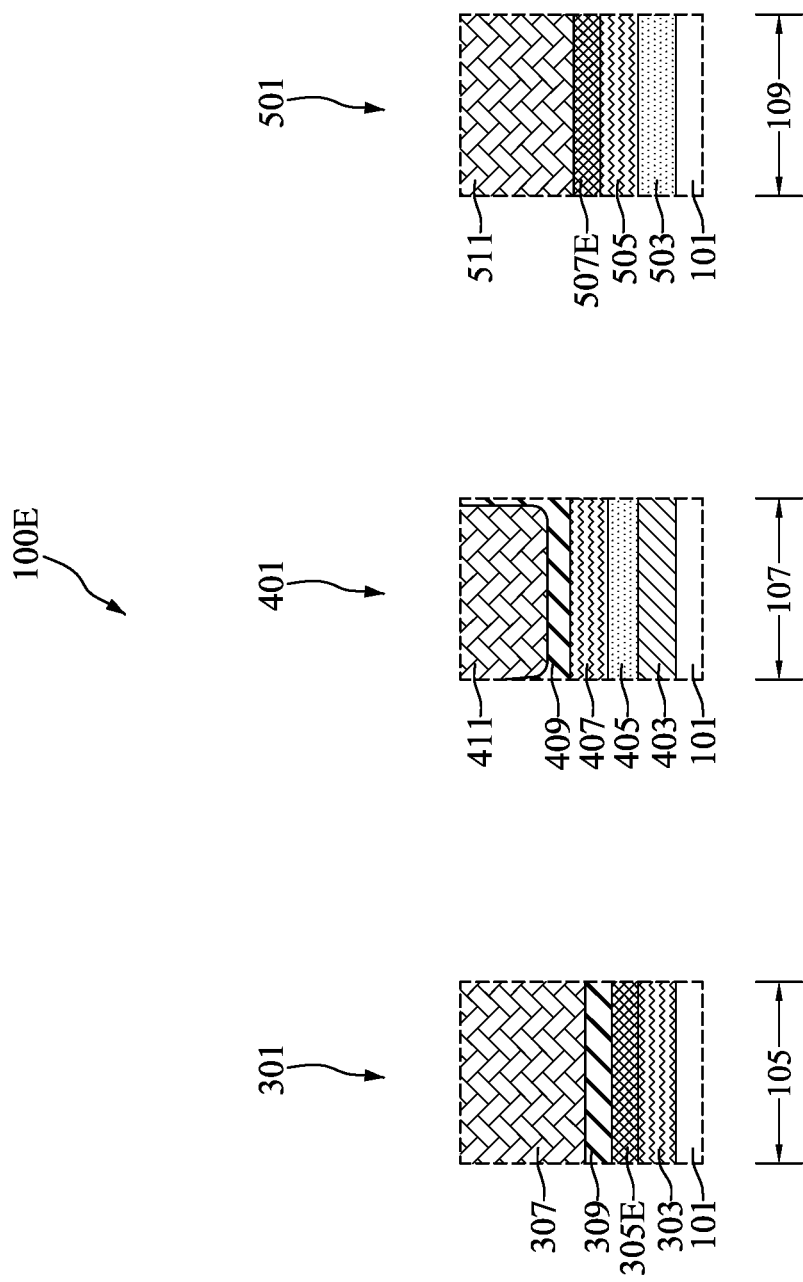
FIG. 11 illustrates, in a schematic enlarged cross-sectional view diagram, the semiconductor device in accordance with FIG. 10.

FIG. 10 illustrates, in a schematic cross-sectional view diagram, a semiconductor device 100E in accordance with another embodiment of the present disclosure. FIG. 11 illustrates, in a schematic enlarged cross-sectional view diagram, the semiconductor device 100E in accordance with FIG. 10.

With reference to FIGS. 10 and 11 and in contrast to FIG. 8, the two third doped regions 205E may have the first electrical type and may be doped with a dopant such as phosphorus, arsenic, or antimony. The third semiconductor unit 501 may include the third bottom insulating layer 503, the third top insulating layer 505, the third bottom conductive layer 507E, and the third filler layer 511. The third bottom insulating layer 503 may be inwardly disposed in the third active region 109. The third top insulating layer 505 may be disposed on the third bottom insulating layer 503. The third bottom conductive layer 507E may be disposed on the third top insulating layer 505. The third bottom conductive layer 507E may have a same thickness as the second bottom conductive layer 409 and may be formed of a same material as the second bottom conductive layer 409. The third filler layer 511 may be directly disposed on the third bottom conductive layer 507E.

Figure 12:
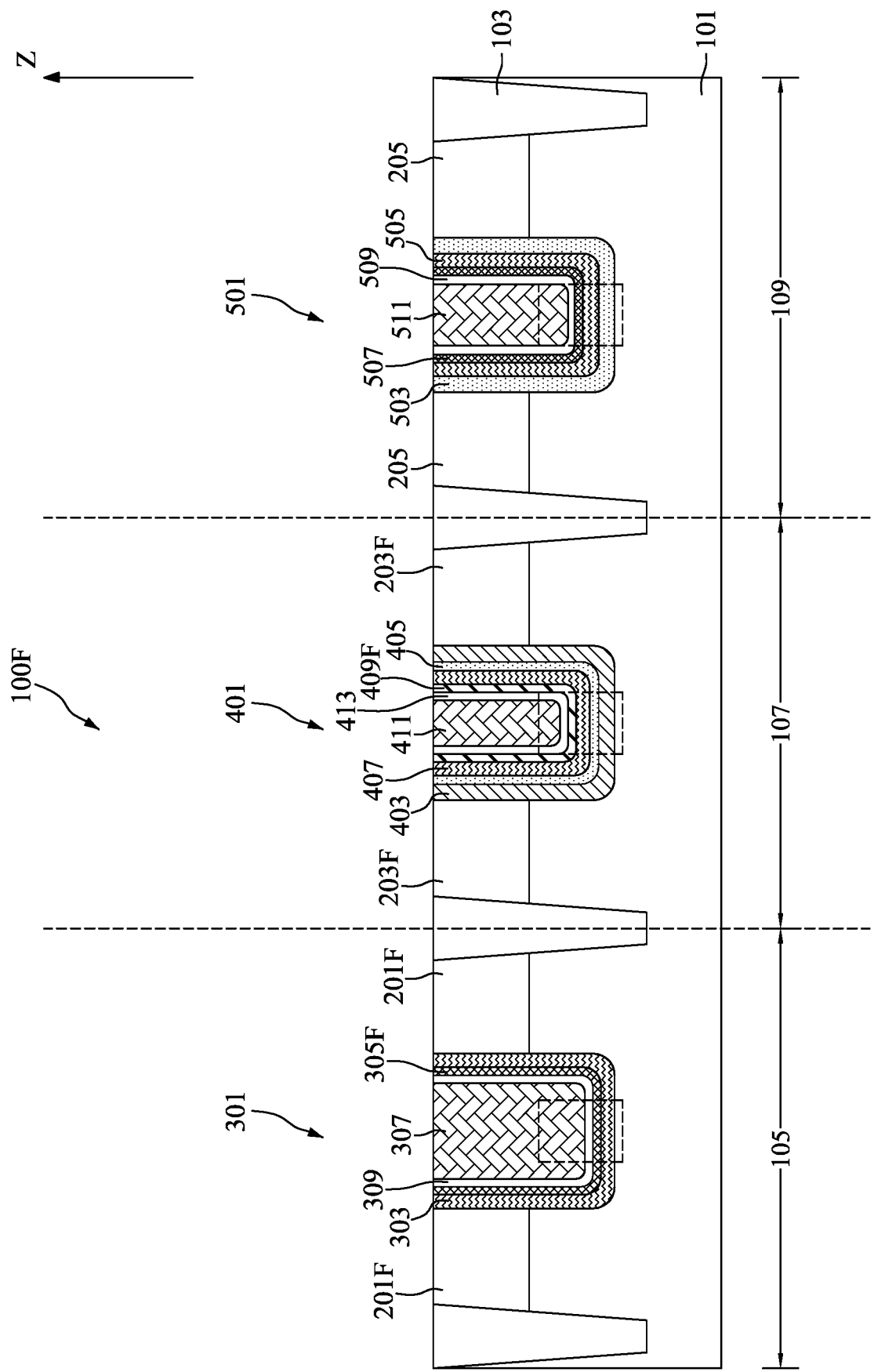
FIG. 12 illustrates, in a schematic cross-sectional view diagram, a semiconductor device in accordance with another embodiment of the present disclosure.
Figure 13:
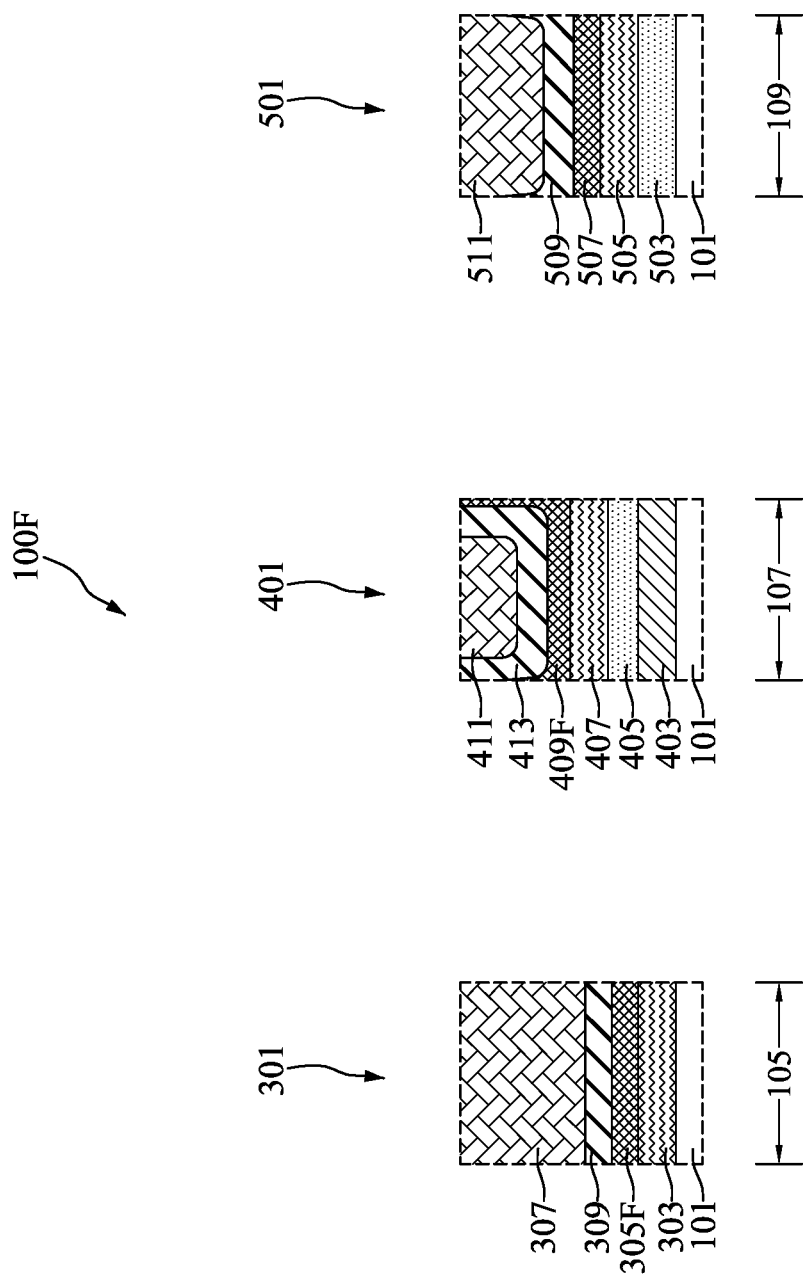
FIG. 13 illustrates, in a schematic enlarged cross-sectional view diagram, the semiconductor device in accordance with FIG. 12.

FIG. 12 illustrates, in a schematic cross-sectional view diagram, a semiconductor device 100F in accordance with another embodiment of the present disclosure. FIG. 13 illustrates, in a schematic enlarged cross-sectional view diagram, the semiconductor device 100F in accordance with FIG. 12.

With reference to FIGS. 12 and 13 and in contrast to FIG. 8, the two second doped regions 203F may have the second electrical type and may be doped with a dopant such as boron. The second semiconductor unit 401 may include the second bottom insulating layer 403, the second middle insulating layer 405, the second top insulating layer 407, the second bottom conductive layer 409F, the second filler layer 411, and a second top conductive layer 413. The second bottom insulating layer 403 may be inwardly disposed in the second active region 107. The second middle insulating layer 405 may be disposed on the second bottom insulating layer 403. The second top insulating layer 407 may be disposed on the second middle insulating layer 405. The second bottom conductive layer 409F may be disposed on the second top insulating layer 407. The second bottom conductive layer 409F may have a same thickness as the third bottom conductive layer 507 and may be formed of a same material as the third bottom conductive layer 507. The second top conductive layer 413 may be disposed on the second bottom conductive layer 409F. The second top conductive layer 413 may have a same thickness as the third top conductive layer 509 and may be formed of a same material as the third top conductive layer 509. The second filler layer 411 may be disposed on the second top conductive layer 413.

Figure 14:
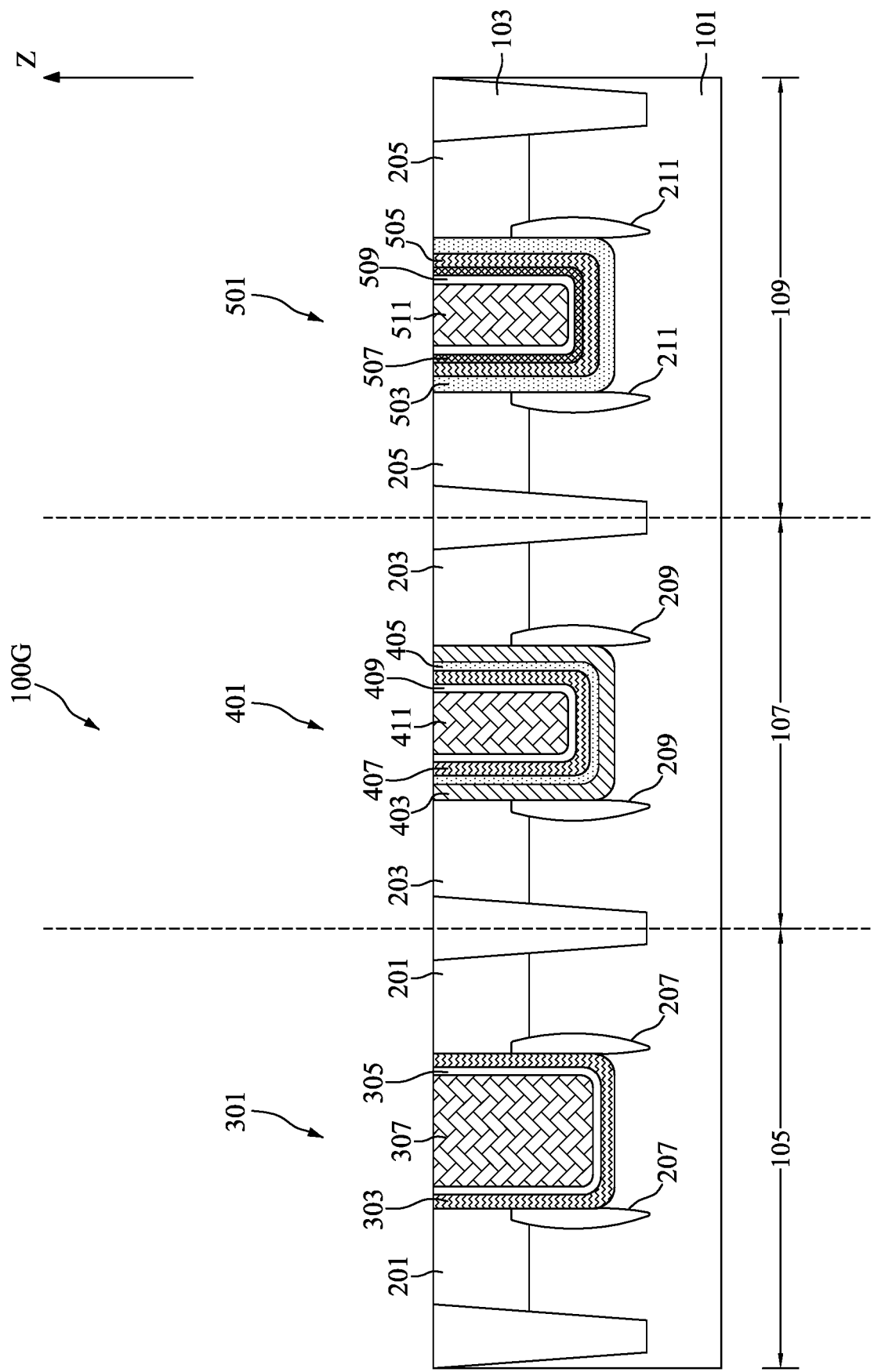
FIGS. 14 and 15 illustrate, in schematic cross-sectional view diagrams, semiconductor devices in accordance with some embodiments of the present disclosure.
Figure 15:
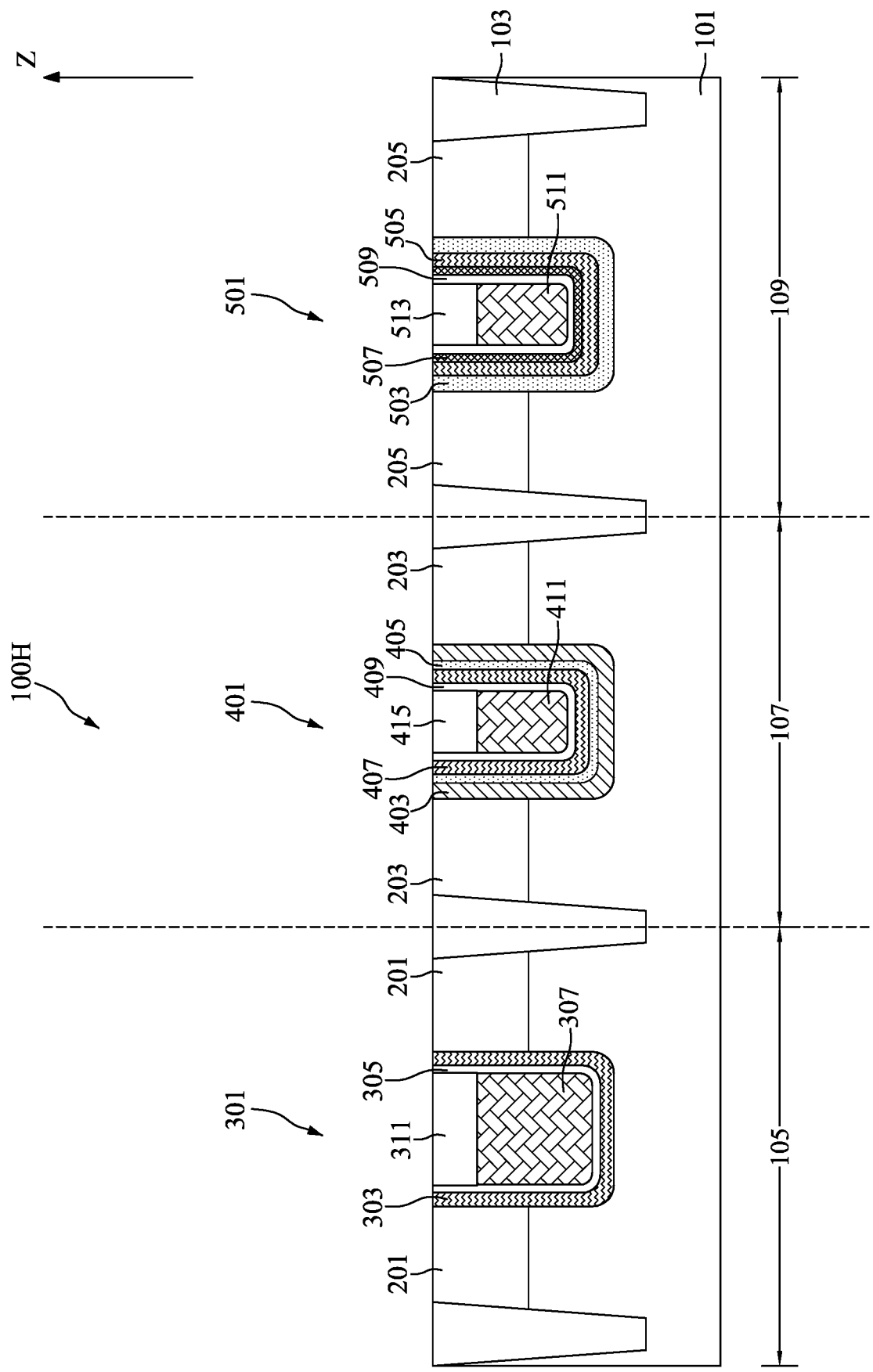

FIGS. 14 and 15 illustrate, in schematic cross-sectional view diagrams, semiconductor devices 100G, 100H in accordance with some embodiments of the present disclosure.

With reference to FIG. 14, the semiconductor device 100G may include a first pair of stress regions 207, a second pair of stress regions 209, and a third pair of stress regions 211. The first pair of stress regions 207 may be disposed in the first active region 105 and respectively correspondingly attached to lower portions of the two sides of the first semiconductor unit 301. In some embodiments, the first pair of stress regions 207 may be attached to lower portions of the two sides of the first bottom insulating layer 303. The first pair of stress regions 207 may be formed of, for example, silicon carbide. The second pair of stress regions 209 may be disposed in the second active region 107 and respectively correspondingly attached to lower portions of the two sides of the second semiconductor unit 401. In some embodiments, the second pair of stress regions 209 may be attached to lower portions of the two sides of the second bottom insulating layer 403. The second pair of stress regions 209 may be formed of a same material as the first pair of stress regions 207. The third pair of stress regions 211 may be disposed in the third active region 109 and respectively correspondingly attached to lower portions of the two sides of the third semiconductor unit 501. In some embodiments, the third pair of stress regions 211 may be attached to lower portions of the two sides of the third bottom insulating layer 503. The third pair of stress regions 211 may be formed of, for example, silicon germanium. The first pair of stress regions 207, the second pair of stress regions 209, and the third pair of stress regions 211 may have lattice constants different form the lattice constant of the substrate 101. The first pair of stress regions 207, the second pair of stress regions 209, and the third pair of stress regions 211 may increase the carrier mobility of the semiconductor device 100G; therefore, the performance of the semiconductor device 100G may be improved.

With reference to FIG. 15, the first semiconductor unit 301 may further include a first capping layer 311. The first capping layer 311 may be disposed on the first filler layer 307 and may be formed of, for example, silicon oxide, silicon nitride, silicon oxynitride, silicon nitride oxide, or fluoride-doped silicate. A top surface of the first capping layer 311 may be even with the top surface of the substrate 101. The second semiconductor unit 401 may further include a second capping layer 415. The second capping layer 415 may be disposed on the second filler layer 411 and may be formed of a same material as the first capping layer 311. The third semiconductor unit 501 may further include a third capping layer 513. The third capping layer 513 may be disposed on the third filler layer 511 and may be formed of a same material as the first capping layer 311.

Figure 16:
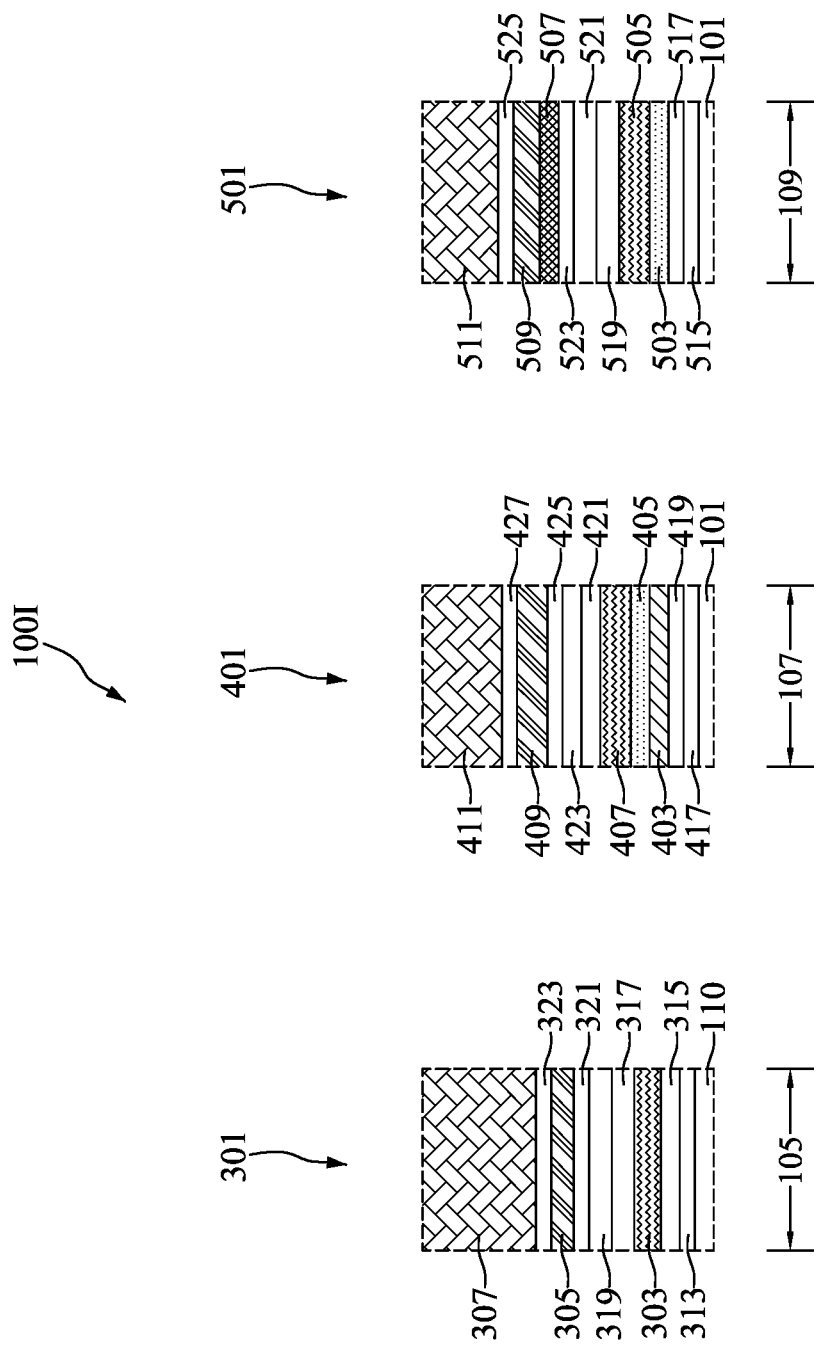
FIG. 16 illustrates, in a schematic enlarged cross-sectional view diagram, a semiconductor device in accordance with one embodiment of the present disclosure.

FIG. 16 illustrates, in a schematic enlarged cross-sectional view diagram, a semiconductor device 100I in accordance with one embodiment of the present disclosure.

With reference to FIG. 16, the first semiconductor unit 301 may further include a first interfacial layer 313, a first dipole layer 315, a first functional layer 317, a first adjustment layer 319, a first protection layer 321, and a first encapsulation layer 323. The first interfacial layer 313 may be disposed between the substrate 101 and the first bottom insulating layer 303. The first interfacial layer 313 may facilitate formation of the first bottom insulating layer 303.

The first interfacial layer 313 may have a thickness between about 5 angstroms and about 20 angstroms. The first interfacial layer 313 may be formed of a chemical oxide of the underlying substrate 101 such as silicon oxide. The first dipole layer 315 may be disposed between the first bottom insulating layer 303 and the first interfacial layer 313. The first dipole layer 315 may have a thickness less than 2 nm. The first dipole layer 315 may displace defects in the first bottom insulating layer 303 and improve the mobility and reliability of the first semiconductor unit 301. The first dipole layer 315 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide.

With reference to FIG. 16, the first functional layer 317 may be disposed on the first bottom insulating layer 303. The first functional layer 317 may have a thickness between about 10 angstroms and about angstroms and may be formed of, for example, titanium nitride or tantalum nitride. The first functional layer 317 may protect the first bottom insulating layer 303 from damage during subsequent semiconductor processes. The first adjustment layer 319 may be disposed on the first functional layer 317 and may include a material or an alloy including lanthanide nitride. The first adjustment layer 319 may be used to fine-tune the first threshold voltage. The first protection layer 321 may be disposed on the first adjustment layer 319 and may protect the first adjustment layer 319 from damage during subsequent semiconductor processes. The first protection layer 321 may be formed of, for example, titanium nitride.

With reference to FIG. 16, the first encapsulation layer 323 may be disposed between the first bottom conductive layer 305 and the first filler layer 307. The first encapsulation layer 323 may have a thickness between about 15 angstroms and about 25 angstroms. The first encapsulation layer 323 may be formed of, for example, titanium nitride. The first encapsulation layer 323 may protect layers below the first encapsulation layer 323 from mechanical damage or diffusion of the first filler layer 307. The second semiconductor unit 401 may further include a second interfacial layer 417, a second dipole layer 419, a second functional layer 421, a second adjustment layer 423, a second protection layer 425, and a second encapsulation layer 427. The third semiconductor unit 501 may further include a third interfacial layer 515, a third dipole layer 517, a third functional layer 519, a third adjustment layer 521, a third protection layer 523, and a third encapsulation layer 525. The aforementioned layers of the second semiconductor unit 401 and the third semiconductor unit 501 may be disposed in a manner similar to that of the first semiconductor unit 301.

Figure 17:
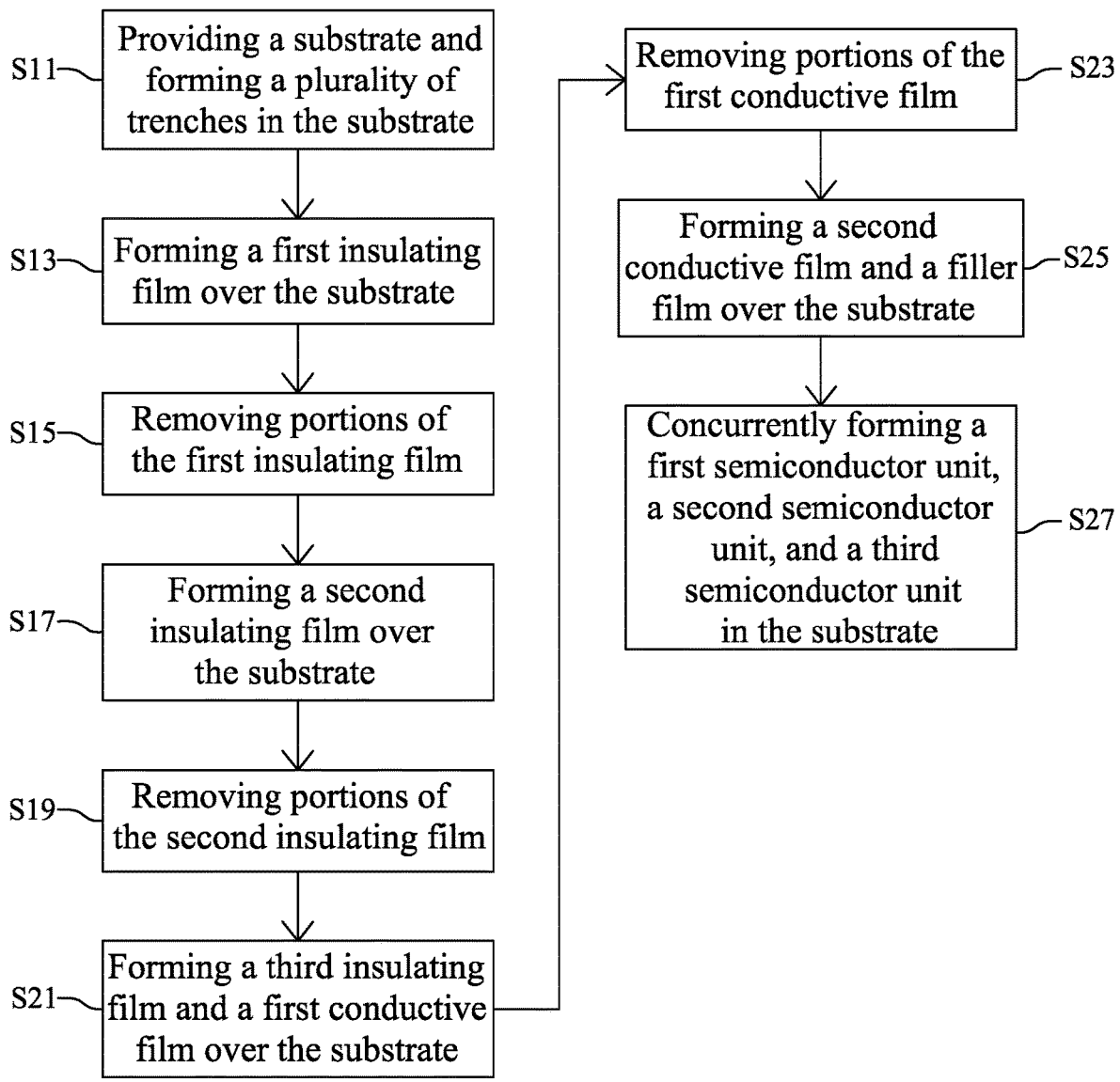
FIG. 17 illustrates, in a flowchart diagram form, a method 30 for fabricating a semiconductor device in accordance with one embodiment of the present disclosure.

FIG. 17 illustrates, in a flowchart diagram form, a method 30 for fabricating a semiconductor device 100A in accordance with one embodiment of the present disclosure. FIGS. 18 to 31 illustrate, in schematic cross-sectional diagrams, a flow of fabricating the semiconductor device 100A in accordance with one embodiment of the present disclosure.

Figure 18:
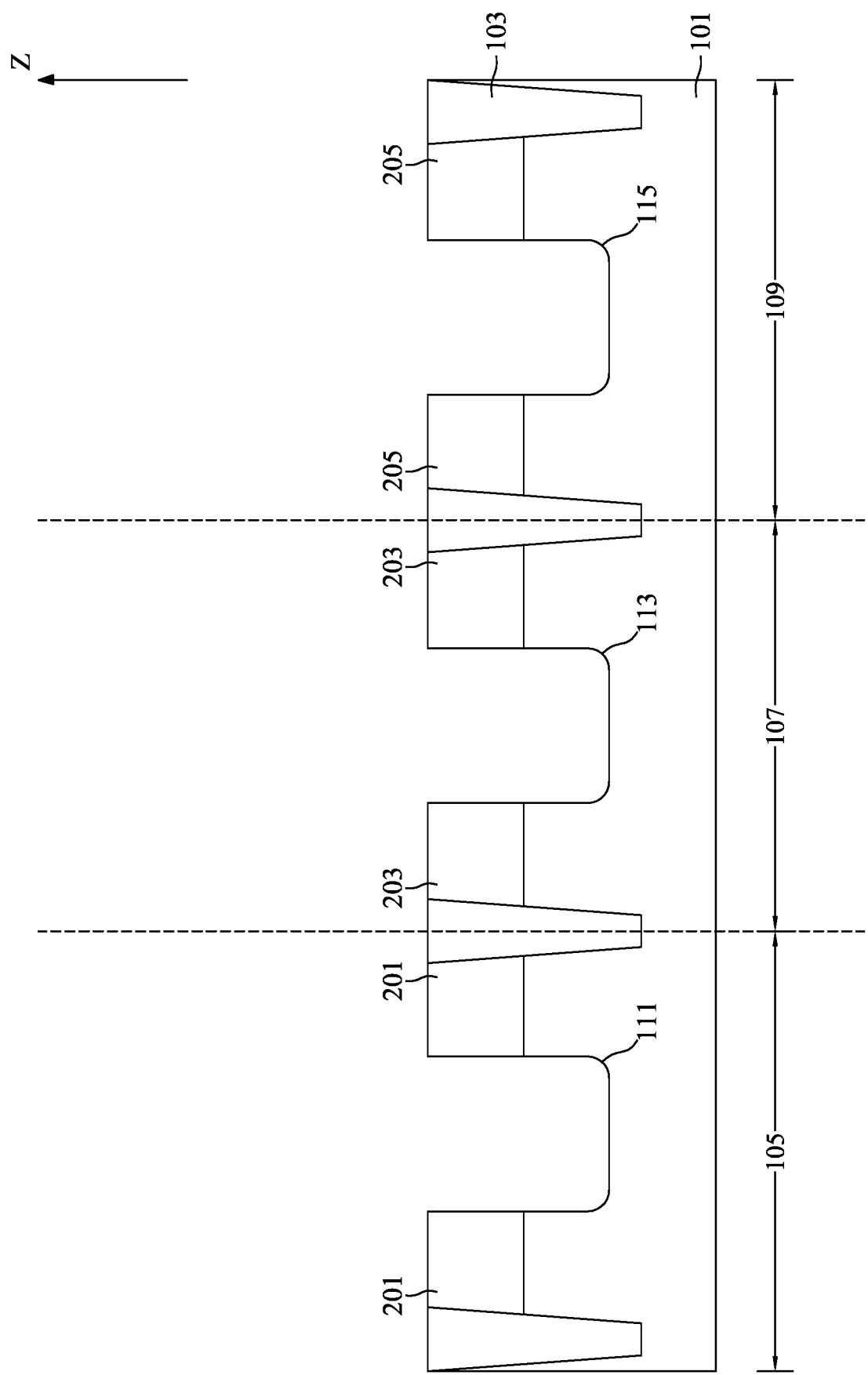
FIGS. 18 to 31 illustrate, in schematic cross-sectional diagrams, a flow of fabricating a semiconductor device in accordance with one embodiment of the present disclosure.

With reference to FIGS. 17 and 18, at step S11, in the embodiment depicted, a substrate 101 may be provided and a plurality of trenches may be formed in the substrate 101. An isolation layer 103 may be formed in the substrate 101 and may define a first active region 105, a second active region 107, and a third active region 109. A plurality of doped regions may be formed in the substrate 101 by implantation processes. The plurality of trenches may be respectively correspondingly formed in the first active region 105, the second active region 107, and the third active region 109. In some embodiments, the plurality of trenches may include a first trench 111, a second trench 113, and a third trench 115. The first trench 111 may be formed in the first active region 105. The second trench 113 may be formed in the second active region 107. The third trench 115 may be formed in the third active region 109. The plurality of doped regions may be respectively correspondingly divided by the plurality of trenches and turned into two first doped regions 201 in the first active region 105, two second doped regions 203 in the second active region 107, and two third doped regions 205 in the third active region 109.

Figure 19:
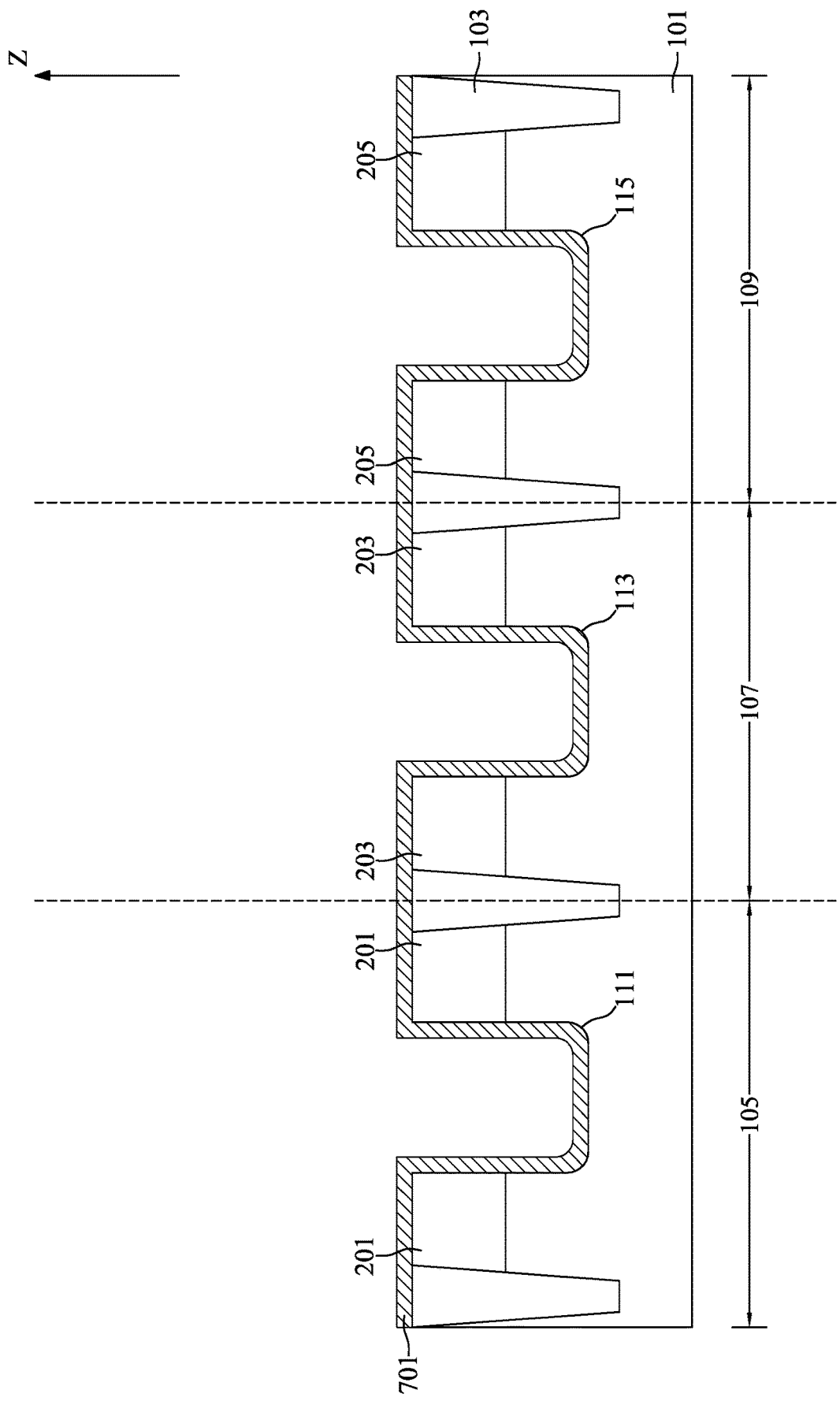

With reference to FIGS. 17 and 19, at step S13, in the embodiment depicted, a first insulating film 701 may be formed over the substrate 101. The first insulating film 701 may be conformally formed over a top surface of the substrate 101 and in the plurality of trenches by a deposition process such as physical vapor deposition, atomic layer deposition, chemical vapor deposition, sputtering, or the like. The first insulating film 701 may have a thickness between about 0.1 nm and about 3.0 nm. The first insulating film 701 may be formed of, for example, silicon oxide, silicon nitride, silicon oxynitride, silicon nitride oxide, or the like. Alternatively, in another embodiment, the first insulating film 701 may be formed of an insulating material having a dielectric constant of about 4.0 or greater.

Figure 20:
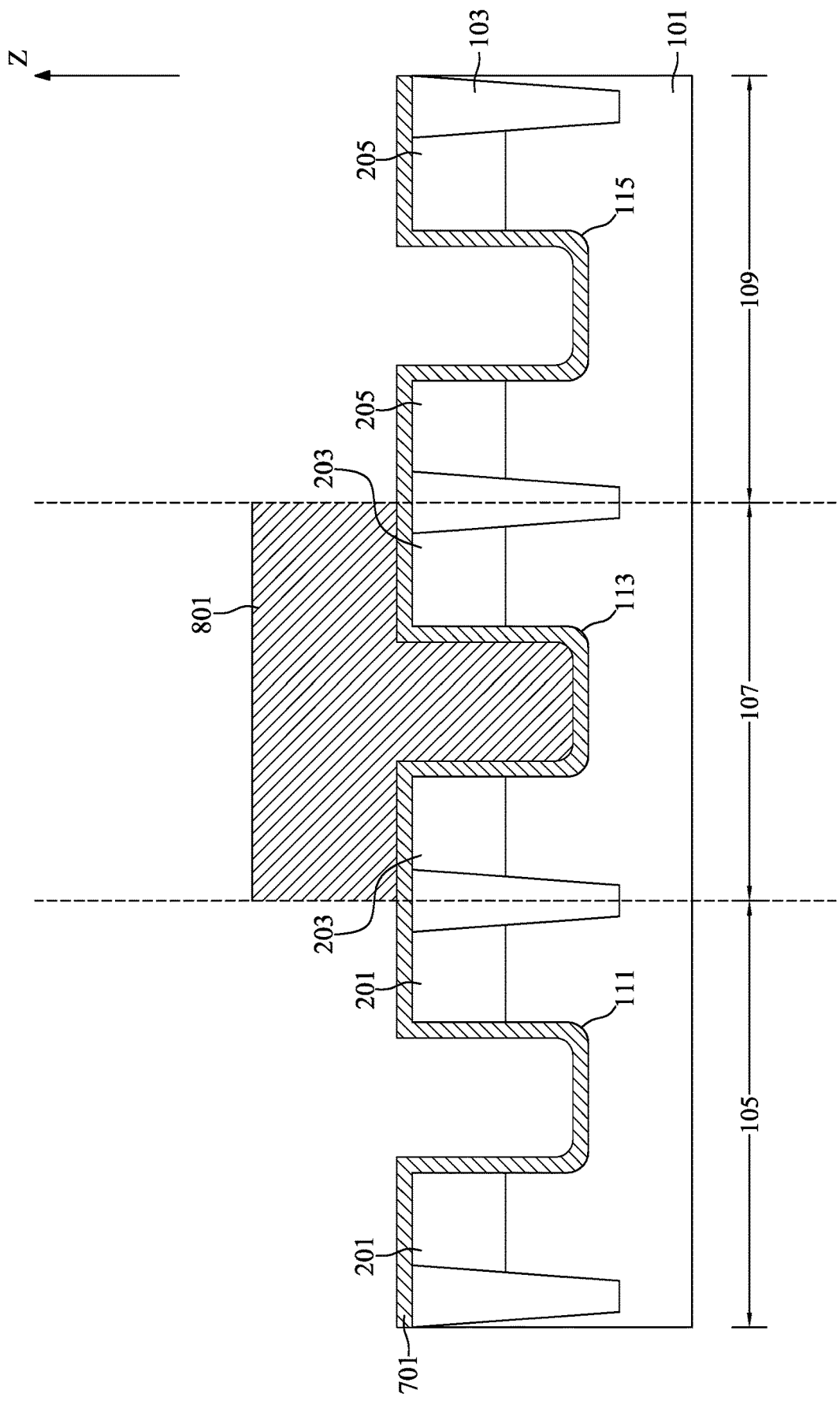
Figure 21:
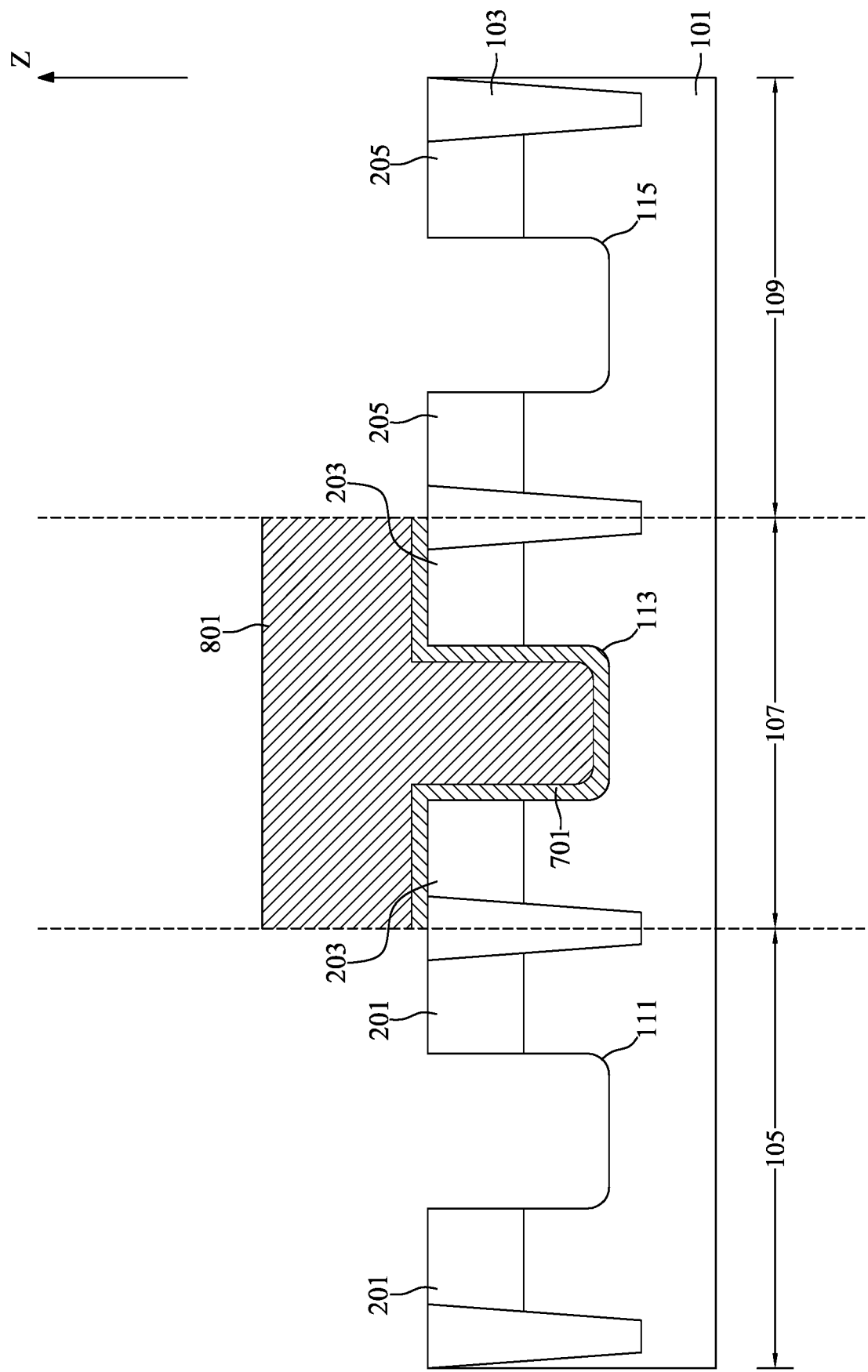

With reference to FIGS. 17, 20, and 21, at step S15, in the embodiment depicted, portions of the first insulating film 701 may be removed. With reference to FIG. 20, a photolithography process may be performed using a first mask layer 801 as a mask for the second active region 107. The first mask layer 801 may be a photoresist layer. With reference to FIG. 21, an etch process may be performed to remove the portions of the first insulating film 701 formed at the first active region 105 and the third active region 109. The first insulating film 701 formed at the second active region 107 may be retained. After the etch process, the first mask layer 801 may be removed.

Figure 22:
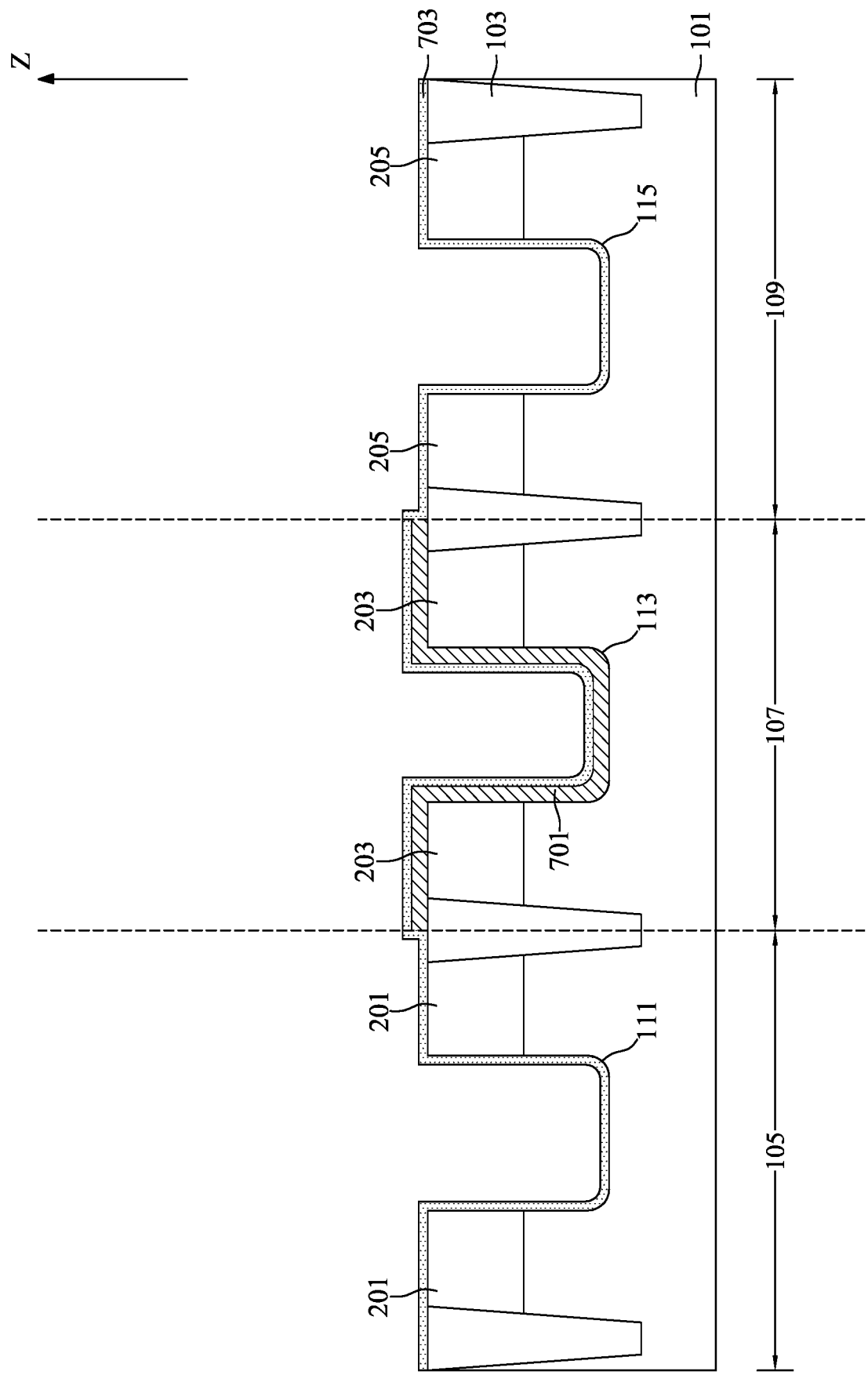

With reference to FIGS. 17 and 22, at step S17, in the embodiment depicted, a second insulating film 703 may be formed over the substrate 101. The second insulating film 703 may be conformally formed over the top surface of the substrate 101, on the first insulating film 701, and in the first trench 111 and the third trench 115. The second insulating film 703 may be formed by a deposition process similar to that of step S13. The second insulating film 703 may have a thickness between about 0.1 nm and about 2.0 nm. The second insulating film 703 may be formed of a same material as the first insulating film 701, but is not limited thereto.

Figure 23:
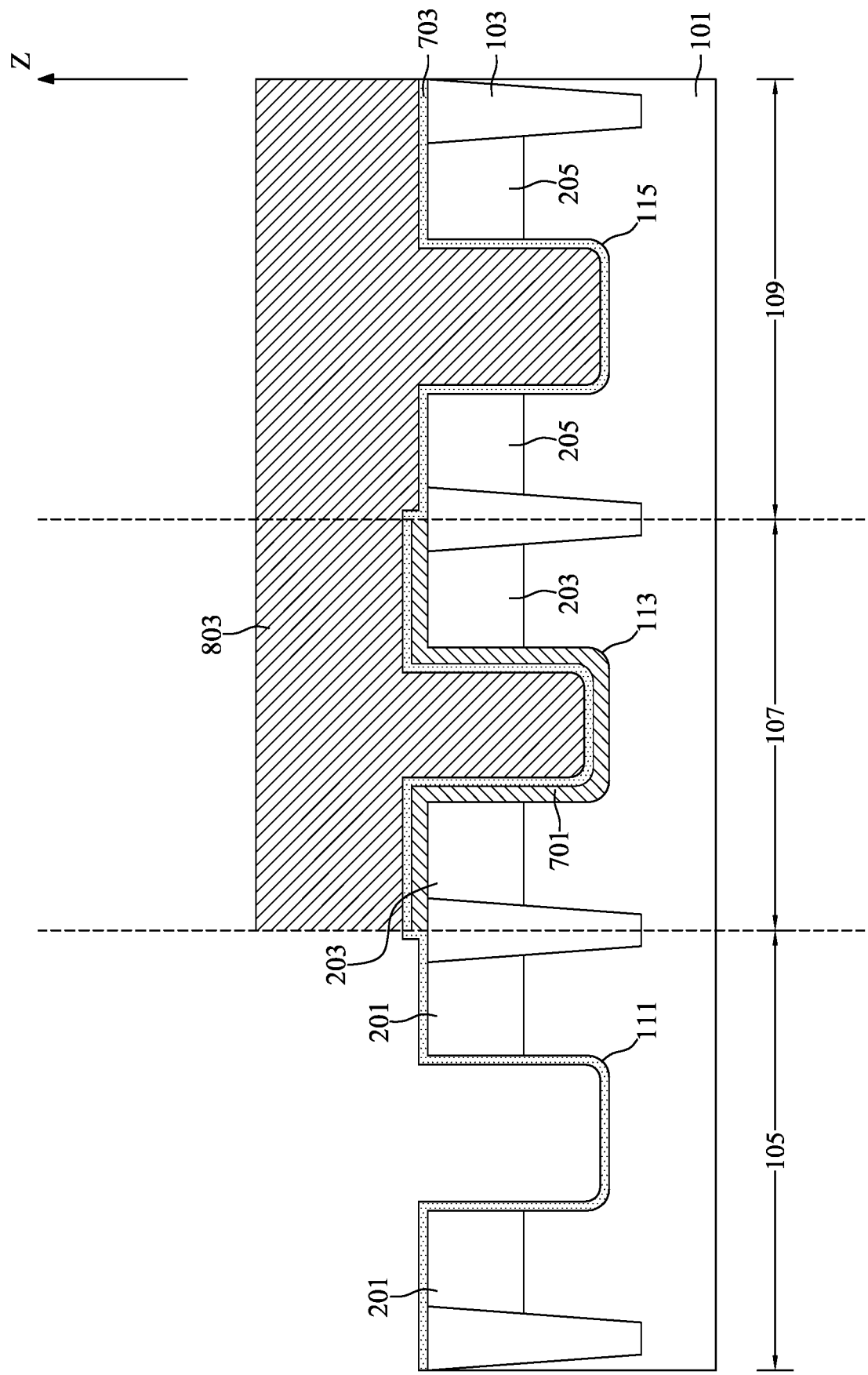
Figure 24:
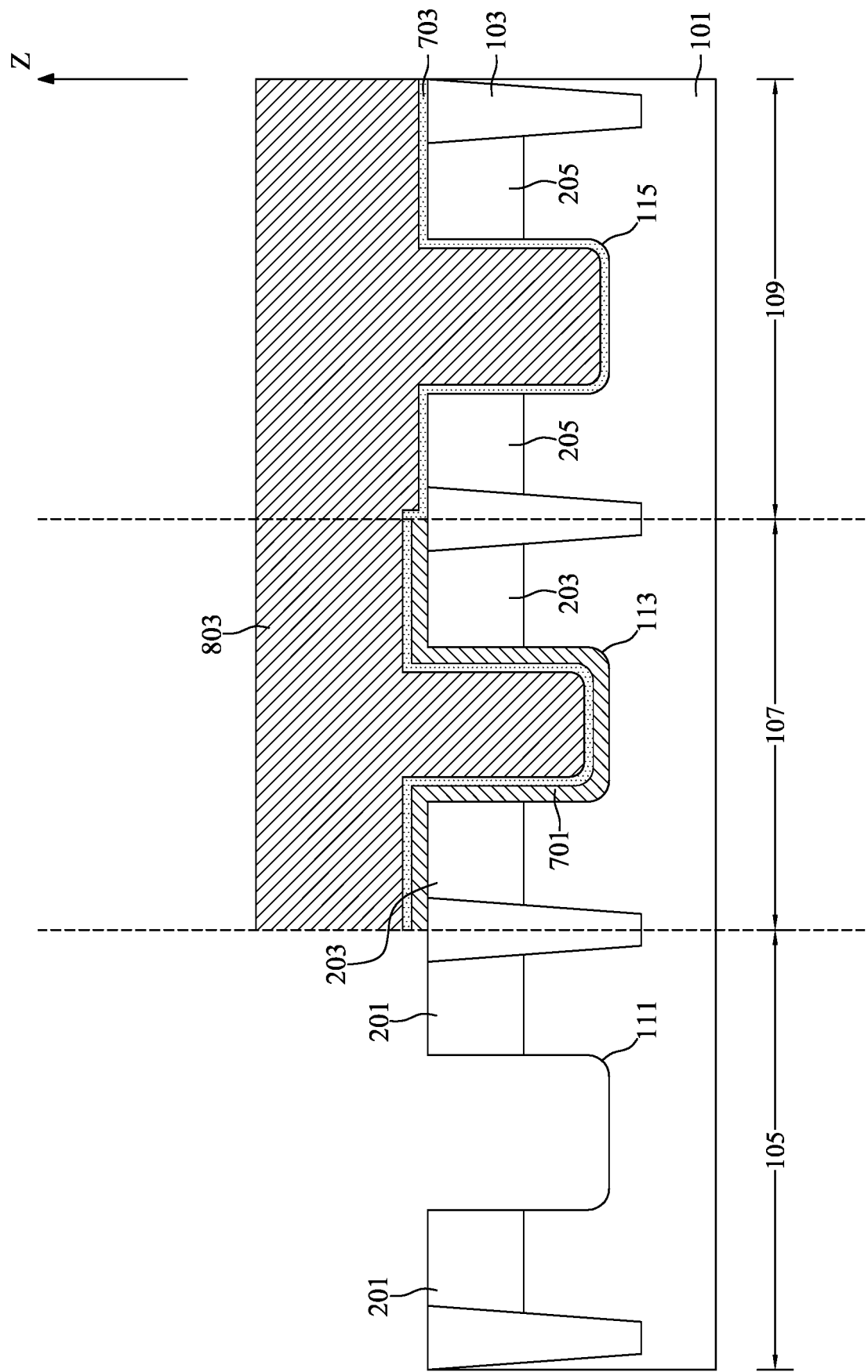

With reference to FIGS. 17, 23, and 24, at step S19, in the embodiment depicted, portions of the second insulating film 703 may be removed. With reference to FIG. 23, a photolithography process may be performed using a second mask layer 803 as a mask for the second active region 107 and the third active region 109. The second mask layer 803 may be a photoresist layer. With reference to FIG. 24, an etch process may be performed to remove the portions of the second insulating film 703 formed at the first active region 105. The second insulating film 703 formed at the second active region 107 and the third active region 109 may be retained. After the etch process, the second mask layer 803 may be removed.

Figure 25:
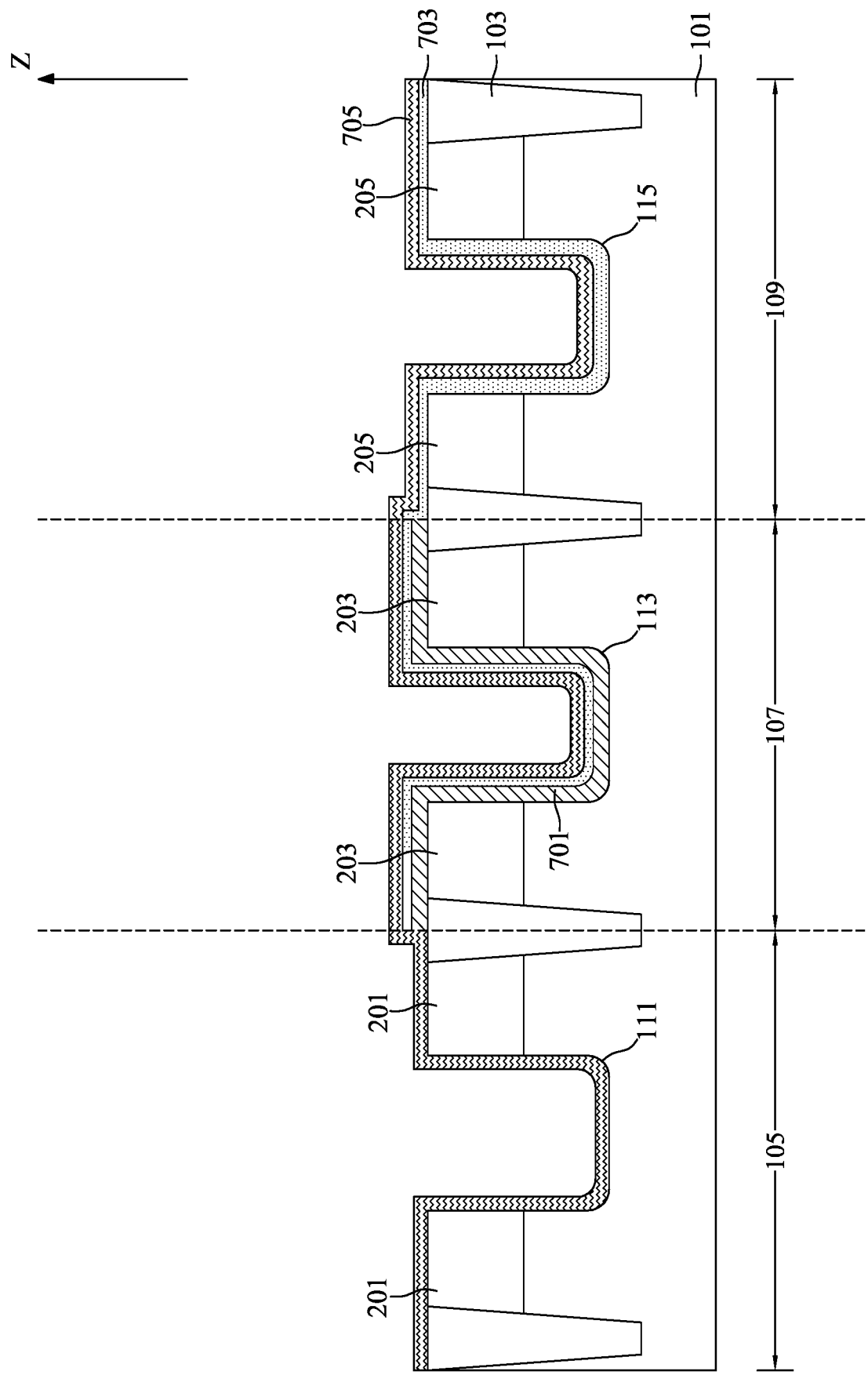
Figure 26:
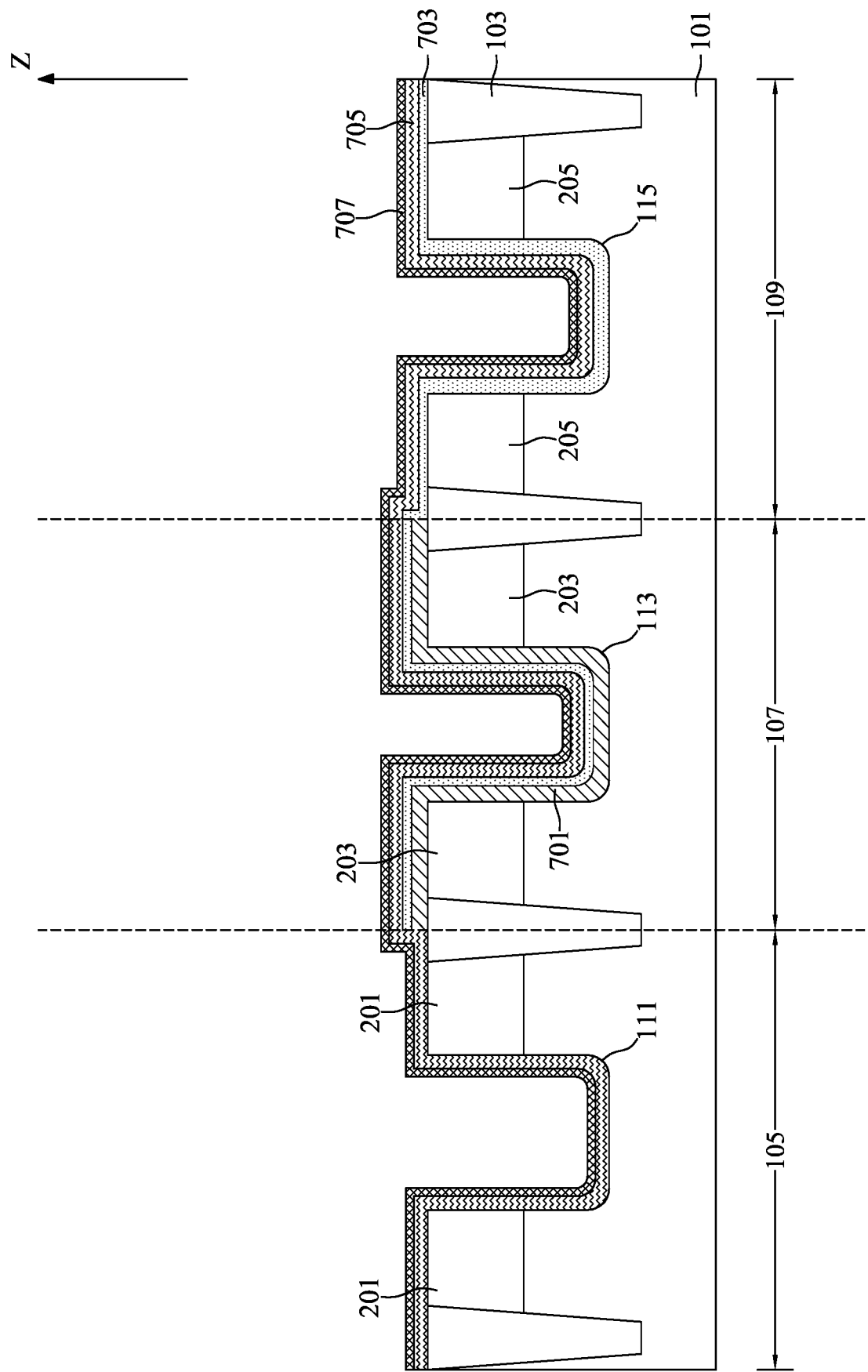

With reference to FIGS. 17, 25, and 26, at step S21, in the embodiment depicted, a third insulating film 705 and a first conductive film 707 may be formed over the substrate 101. With reference to FIG. the third insulating film 705 may be conformally formed over the top surface of the substrate 101 and on the second insulating film 703. The third insulating film 705 may have a thickness between about 0.5 nm and about 5.0 nm. With reference to FIG. 26, the first conductive film 707 may be formed on the third insulating film 705. The first conductive film 707 may have a thickness between about 10 angstroms and about 100 angstroms. The first conductive film 707 may be formed of, for example, titanium nitride, tantalum nitride, tantalum carbide, tungsten nitride, or ruthenium. The third insulating film 705 and the first conductive film 707 may be formed by deposition processes similar to those of step S13.

Figure 27:
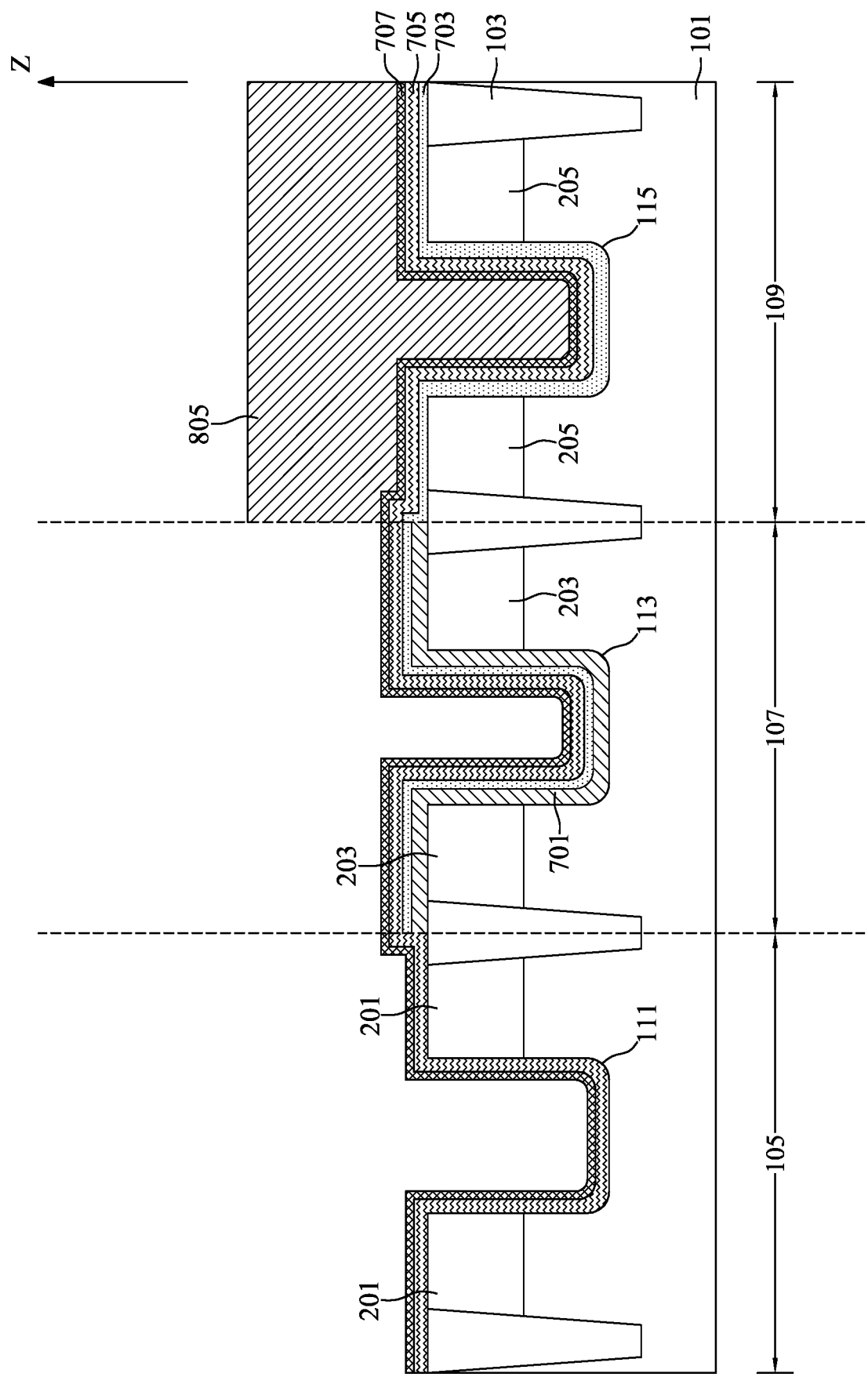
Figure 28:
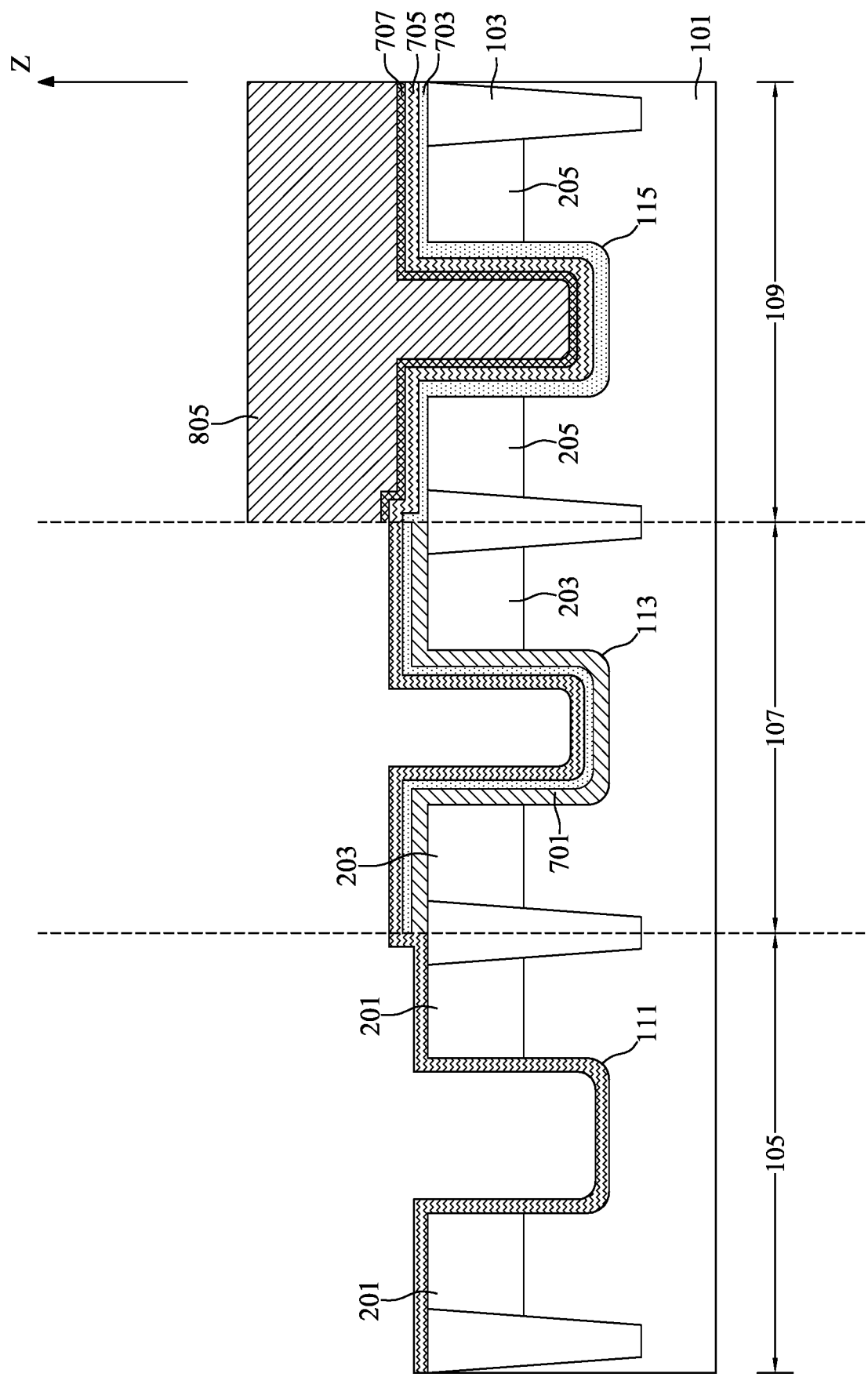

With reference to FIGS. 17, 27, and 28, at step S23, in the embodiment depicted, portions of the first conductive film 707 may be removed. With reference to FIG. 27, a photolithography process may be performed using a third mask layer 805 as a mask for the third active region 109. The third mask layer 805 may be a photoresist layer. With reference to FIG. 28, an etch process may be performed to remove the portions of the first conductive film 707 formed at the first active region 105 and the second active region 107. The first conductive film 707 formed at the third active region 109 may be retained. After the etch process, the third mask layer 805 may be removed.

Figure 29:
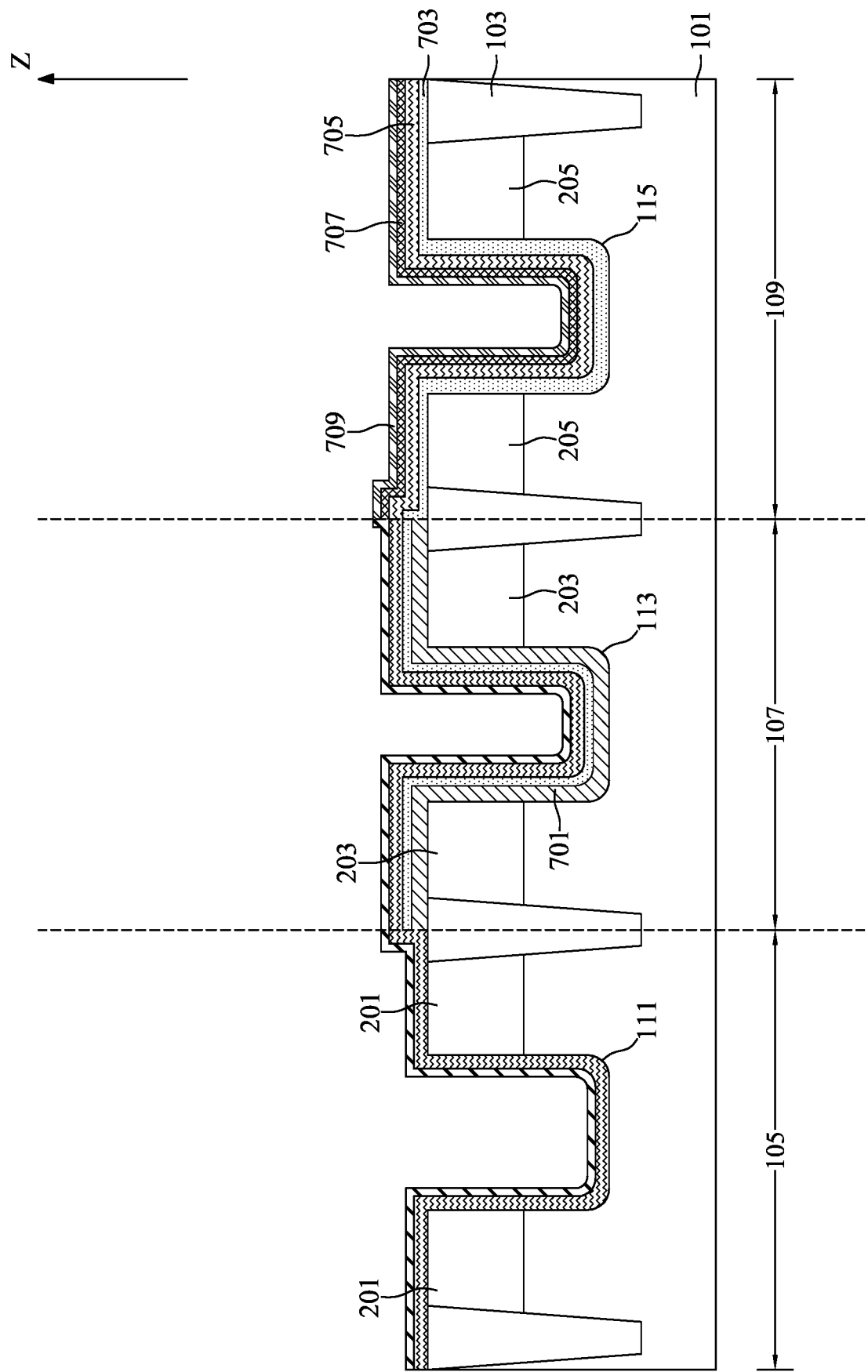
Figure 30:
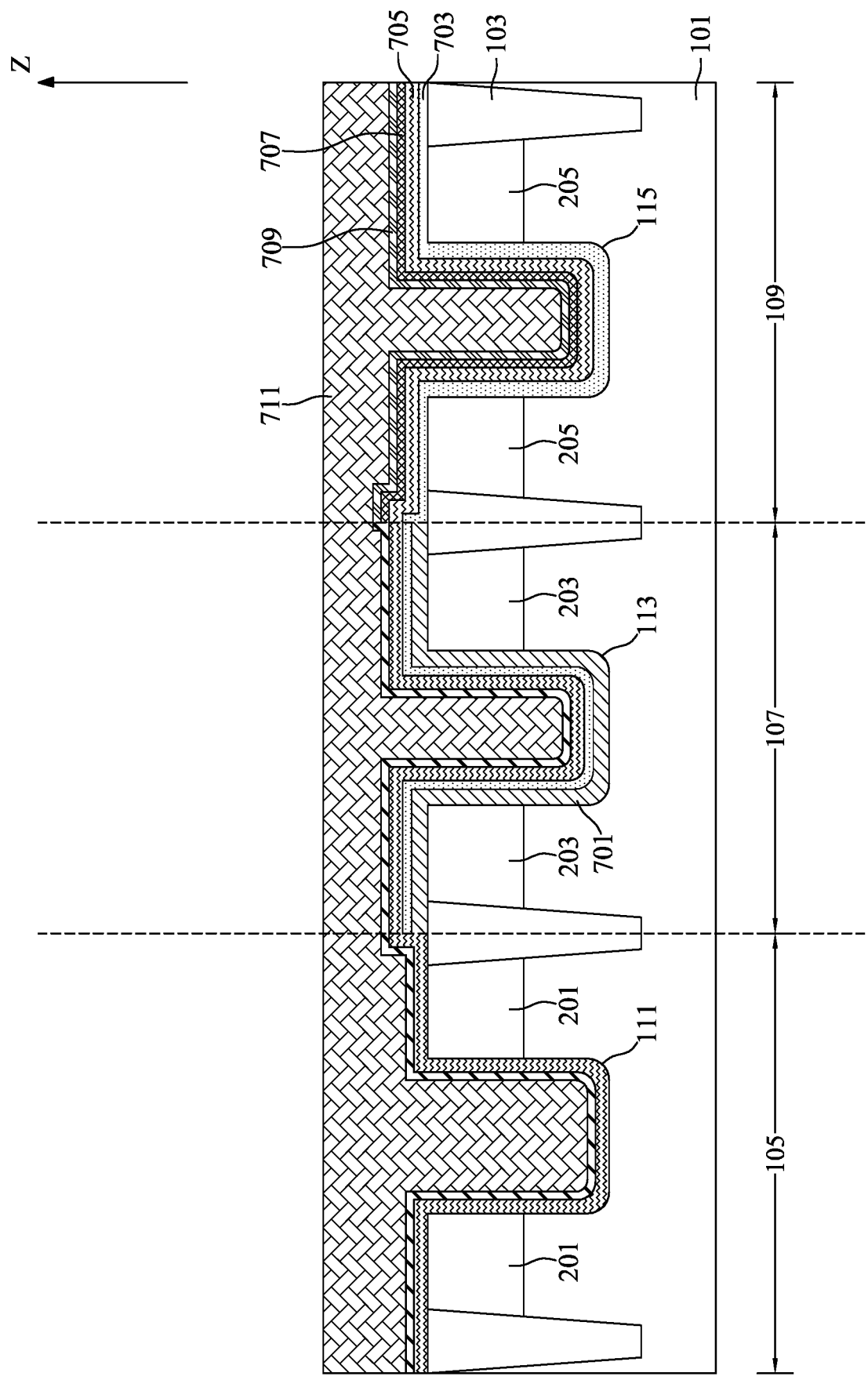

With reference to FIGS. 17, 29, and 30, at step S25, in the embodiment depicted, a second conductive film 709 and a filler film 711 may be formed over the substrate 101. With reference to FIG. 29, the second conductive film 709 may be formed on the third insulating film 705 and the first conductive film 707. The second conductive film 709 may have a thickness between about 10 angstroms and about 200 angstroms. The second conductive film 709 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. With reference to FIG. 30, the filler film 711 may be formed on the second conductive film 709 and may fill the first trench 111, the second trench 113, and the third trench 115. The filler film 711 may be formed of, for example, tungsten or aluminum.

Figure 31:
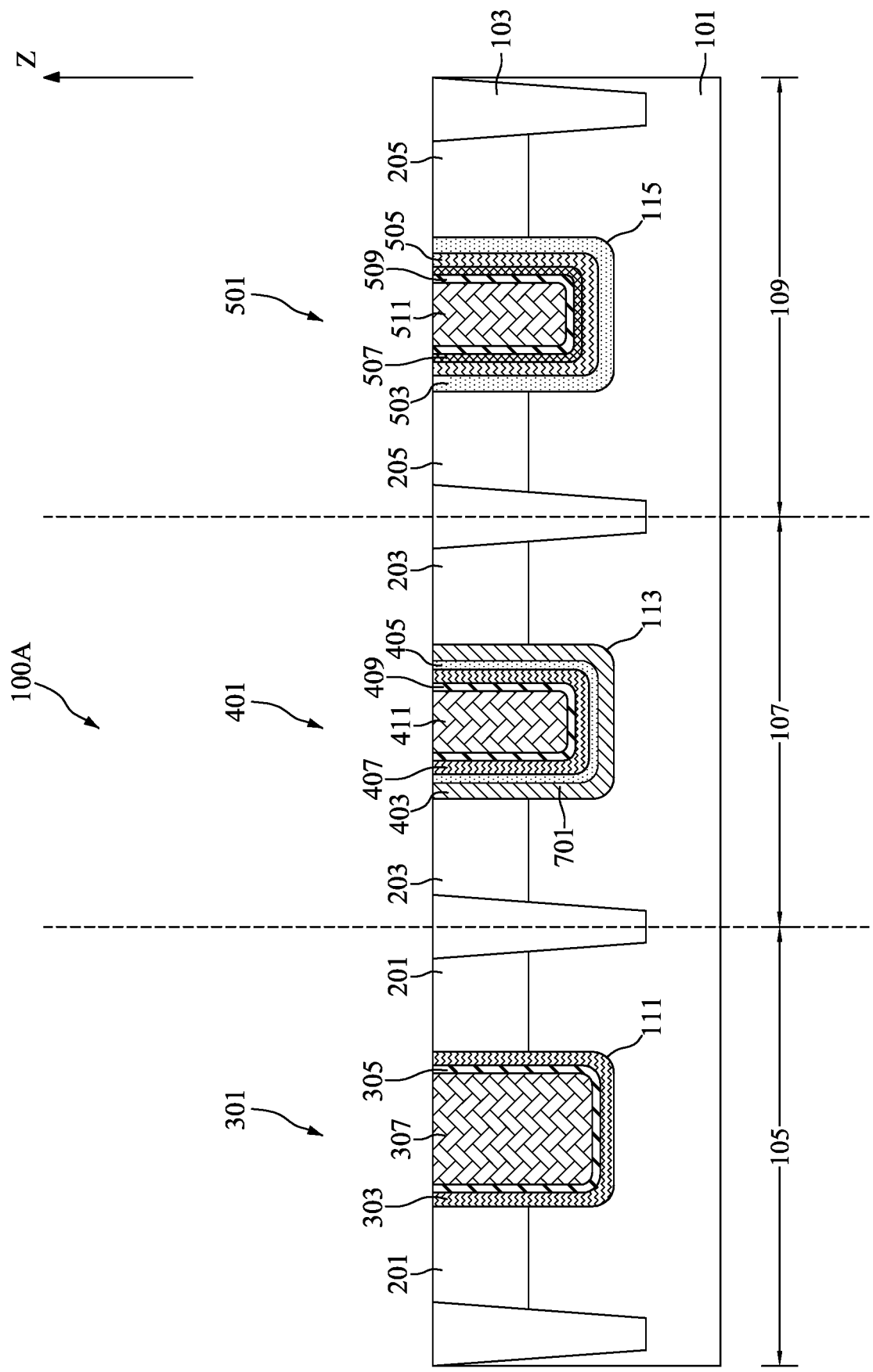

With reference to FIGS. 17 and 31, at step S27, in the embodiment depicted, a first semiconductor unit 301, a second semiconductor unit 401, and a third semiconductor unit 501 may be concurrently formed in the substrate 101. A planarization process, such as chemical mechanical polishing, may be performed to remove excess material, provide a substantially flat surface for subsequent processing steps, and conformally form the first semiconductor unit 301, the second semiconductor unit 401, and the third semiconductor unit 501. After the planarization process, the first insulating film 701 may be turned into a second bottom insulating layer 403. The second insulating film 703 may be turned into a second middle insulating layer 405 and a third bottom insulating layer 503. The third insulating film 705 may be turned into a first bottom insulating layer 303, a second top insulating layer 407, and a third top insulating layer 505. The first conductive film 707 may be turned into a third bottom conductive layer 507. The second conductive film 709 may be turned into a first bottom conductive layer 305, a second bottom conductive layer 409, and a third top conductive layer 509. The filler film 711 may be turned into a first filler layer 307, a second filler layer 411, and a third filler layer 511.

With reference to FIG. 31, the first bottom insulating layer 303, the first bottom conductive layer 305, and the first filler layer 307 together form the first semiconductor unit 301 in the first active region 105. The second bottom insulating layer 403, the second middle insulating layer 405, the second top insulating layer 407, the second bottom conductive layer 409, and the second filler layer 411 together form the second semiconductor unit 401 in the second active region 107. The third bottom insulating layer 503, the third top insulating layer 505, the third bottom conductive layer 507, the third top conductive layer 509, and the third filler layer 511 together form the third semiconductor unit 501 in the third active region 109.

Due to the design of the semiconductor device of the present disclosure, the first semiconductor unit 301, the second semiconductor unit 401, and the third semiconductor unit 501 may have different threshold voltages and may provide different functions; therefore, the applicability of the semiconductor device may be increased. In addition, the carrier mobility of the semiconductor device may be improved due to presence of the first pair of stress regions 207, the second pair of stress regions 209, and the third pair of stress regions 211. Furthermore, the threshold voltages of the semiconductor device may be fine-tuned by the first functional layer 317, the second adjustment layer 423, and the third adjustment layer 521.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate and defining a first active region, a second active region, and a third active region; and
    forming a first trench, a second trench, and a third trench in the first active region, the second active region, and the third active region of the substrate respectively, wherein the first trench, the second trench, and the third trench are indented from a top surface of the substrate;
    forming a first insulating film over the first active region, the second active region, and the third active region of the substrate and in the first trench, the second trench, and the third trench;
    removing the first insulating film at the first active region and the third active region of the substrate, wherein the first insulating film is remained at the second active region of the substrate and in the second trench;

forming a second insulating film over the first active region, the second active region, and the third active region of the substrate and in the first trench, the second trench, and the third trench;

removing the second insulating film at the first active region of the substrate, wherein the second insulating film is remained at the second active region and the third active region of the substrate, and in the second trench and the third trench;

forming a third insulating film over the first active region, the second active region, and the third active region of the substrate and in the first trench, the second trench, and the third trench;

forming a first conducive film over the first active region, the second active region, and the third active region of the substrate, on the third insulating film, and in the first trench, the second trench, and the third trench;

removing the first conducive film at the first active region and the second active region of the substrate, wherein the first conducive film is remained at the third active region of the substrate, and in the third trench;

forming a second conducive film over the first active region, the second active region, and the third active region of the substrate, and in the first trench, the second trench, and the third trench;

forming a filler film over the substrate and in the first trench, the second trench, and the third trench;

removing the first insulating film, the second insulating film, the third insulating film, the first conductive film, the second conductive film, and the filler film above the top surface of the substrate; and concurrently forming a first semiconductor unit, a second semiconductor unit, and a third semiconductor unit in the first trench, the second trench, and the third trench of the substrate respectively;

wherein the first semiconductor unit comprises a first insulating stack, the second semiconductor unit comprises a second insulating stack, and the third semiconductor unit comprises a third insulating stack; and thicknesses of the first insulating stack, the second insulating stack, and the third insulating stack are all different.

2. The method for fabricating the semiconductor device of claim 1, wherein in the first active region, the third insulating film is formed on an inner wall of the first trench, and the second conductive film is overlapped on the third insulating film in the first trench;

wherein in the second active region, the first insulating film is formed on an inner wall of the second trench, the second insulating film is overlapped on the first insulating film in the second trench, the third insulating film is overlapped on the second insulating film in the second trench, and the second conductive film is overlapped on the third insulating film in the second trench;

wherein in the third active region, the second insulating film is formed on an inner wall of the third trench, the third insulating film is overlapped on the second insulating film in the third trench, the first conductive film is overlapped on the third insulating film in the third trench, and the second conductive film is overlapped on the first conductive film in the third trench.

3. The method for fabricating the semiconductor device of claim 1, wherein the first semiconductor unit, the second semiconductor unit, and the third semiconductor unit are formed by a planarization process, wherein, in the first active region, the third insulating film is turned into a first bottom insulating layer, the second conductive film is turned into a bottom conductive layer, and the filler film in the first trench is turned into a first filler layer, wherein the first bottom insulating layer, the first bottom conductive layer, and the first filler layer together form the first semiconductor unit in the first trench;

wherein, in the second active region, the first insulating film is turned into a second bottom insulating layer, the second insulating film is turned into a second middle insulating layer, the third insulating film is turned into a second top insulating layer, the second conductive film is turned into a second bottom conductive layer, and the filler film in the second trench is turned into a second filler layer, wherein the second bottom insulating layer, the second middle insulating layer, the second top insulating layer, the second bottom conductive layer, and the second filler layer together form the second semiconductor unit in the second trench;

wherein, in the third active region, the second insulating film is turned into a third bottom insulating layer, the third insulating film is turned into a third top insulating layer, the first conductive film is turned into a third bottom conductive layer, the second conductive film is turned into a third top conductive layer, and the filler film in the third trench is turned into a third filler layer, wherein the third bottom insulating layer, the third top insulating layer, the third bottom conductive layer, the third top conductive layer, and the third filler layer together form the third semiconductor unit in the third trench.

4. The method for fabricating the semiconductor device of claim 1, wherein a thickness of the first insulating stack is less than a thickness of the second insulating stack and a thickness of the third insulating stack; and the thickness of the second insulating stack is less than the thickness of the third insulating stack.

5. The method for fabricating the semiconductor device of claim 1, wherein the first insulating stack comprises a first bottom insulating layer inwardly positioned in the substrate, and the third insulating stack comprises a third bottom insulating layer inwardly positioned in the substrate and a third top insulating layer positioned on the third bottom insulating layer, wherein the third insulating film is turned into the first bottom insulating layer, wherein the second insulating film is turned into the third bottom insulating layer, wherein the third insulating film is turned into the third top insulating layer.

6. The method for fabricating the semiconductor device of claim 5, wherein the second insulating stack comprises a second bottom insulating layer inwardly positioned in the substrate, a second middle insulating layer positioned on the second bottom insulating layer, and a second top insulating layer positioned on the second middle insulating layer, wherein the first insulating film is turned into the second bottom insulating layer, the second insulating film is turned into the second middle insulating layer, wherein the third insulating film is turned into the second top insulating layer.

7. The method for fabricating the semiconductor device of claim 6, wherein the first semiconductor unit further comprises a first bottom conductive layer positioned on the first bottom insulating layer, and the first bottom conductive layer has a thickness between about 10 angstroms and about 200 angstroms, wherein the second conductive film is turned into the bottom conductive layer.

8. The method for fabricating the semiconductor device of claim 7, wherein the first semiconductor unit further comprises a first top conductive layer positioned on the first bottom conductive layer, and the first top conductive layer has a thickness between about 10 angstroms and about 100 angstroms.

9. The method for fabricating the semiconductor device of claim 8, wherein the first semiconductor unit further comprises a first filler layer positioned on the first top conductive layer, and the first filler layer is formed of tungsten or aluminum, wherein the filler film in the first trench is turned into the first filler layer.

10. The method for fabricating the semiconductor device of claim 6, wherein the second semiconductor unit further comprises a second bottom conductive layer positioned on the second top insulating layer, and the second bottom conductive layer has a thickness between about 10 angstroms and about 100 angstroms, wherein the second conductive film is turned into the second bottom conductive layer.

11. The method for fabricating the semiconductor device of claim 10, wherein the second semiconductor unit further comprises a second top conductive layer positioned on the second bottom conductive layer, and the second top conductive layer has a thickness between about 10 angstroms and about 200 angstroms.

12. The method for fabricating the semiconductor device of claim 6, wherein the second semiconductor unit further comprises a second pair of stress regions located at two sides of the second trench and attached to lower portions of the two sides of the second semiconductor unit, and the second pair of stress regions are formed of silicon carbide.

13. The method for fabricating the semiconductor device of claim 6, wherein the third semiconductor unit further comprises a third bottom conductive layer positioned on the third top insulating layer, and the third bottom conductive layer has a thickness between about 10 angstroms and about 100 angstroms, wherein the first conductive film is turned into the third bottom conductive layer.

14. The method for fabricating the semiconductor device of claim 13, wherein the third semiconductor unit further comprises a third top conductive layer positioned on the third bottom conductive layer, and the third top conductive layer has a thickness between about 10 angstroms and about 200 angstroms, wherein the second conductive film is turned into the third top conductive layer.

15. The method for fabricating the semiconductor device of claim 14, wherein the third semiconductor unit further comprises a third filler layer positioned on the third top conductive layer and a third capping layer positioned on the third filler layer, wherein the filler film in the third trench is turned into the third filler layer.

16. The method for fabricating the semiconductor device of claim 11, wherein the second semiconductor unit further comprises a second interfacial layer positioned between the substrate and the second bottom insulating layer, and the second interracial layer has a thickness less than 2 nm.

17. The method for fabricating the semiconductor device of claim 11, wherein the second semiconductor unit further comprises a second functional layer positioned between the second top insulating layer and the second bottom conductive layer, and the second functional layer has a thickness between about 10 angstroms and about 15 angstroms.

18. The method for fabricating the semiconductor device of claim 11 wherein the second semiconductor unit further comprises a second dipole layer positioned between the substrate and the second bottom insulating layer, and the second dipole layer is formed of a material including one or more of lutetium oxide, lutetium silicon oxide, yttrium oxide, yttrium silicon oxide, lanthanum oxide, lanthanum silicon oxide, barium oxide, or barium silicon oxide.

19. The method for fabricating the semiconductor device of claim 11, wherein the second semiconductor unit further comprises a second protection layer positioned between the second top insulating layer and the second bottom conductive layer, and the second protection layer is formed of titanium nitride.

20. The method for fabricating the semiconductor device of claim 11, wherein the second semiconductor unit further comprises a second encapsulation layer positioned between the second filler layer and the second top conductive layer, and the second encapsulation layer has a thickness between about 15 angstroms and about 25 angstroms.

* * * * *